US010663646B2

(12) United States Patent
Horner et al.

(10) Patent No.: US 10,663,646 B2
(45) Date of Patent: May 26, 2020

(54) LED PANEL LIGHTING SYSTEM

(71) Applicant: PERFORMANCE INDICATOR, LLC, Lowell, MA (US)

(72) Inventors: M. Glenn Horner, West Roxbury, MA (US); Ying Li, Nashua, NH (US)

(73) Assignee: BAMBU VAULT LLC, Lowell, MA (US)

( * ) Notice: Subject to any disclaimer, the term of this patent is extended or adjusted under 35 U.S.C. 154(b) by 0 days.

(21) Appl. No.: 15/742,656

(22) PCT Filed: Jul. 7, 2016

(86) PCT No.: PCT/US2016/041333
§ 371 (c)(1),
(2) Date: Jan. 8, 2018

(87) PCT Pub. No.: WO2017/007933
PCT Pub. Date: Jan. 12, 2017

(65) Prior Publication Data
US 2018/0203180 A1    Jul. 19, 2018

Related U.S. Application Data

(60) Provisional application No. 62/193,020, filed on Jul. 15, 2015, provisional application No. 62/190,163, filed on Jul. 8, 2015.

(51) Int. Cl.
*G02F 1/1333*    (2006.01)
*F21V 8/00*    (2006.01)
(Continued)

(52) U.S. Cl.
CPC ............ *G02B 6/0088* (2013.01); *C09K 11/06* (2013.01); *F21V 7/005* (2013.01); *F21V 9/08* (2013.01);
(Continued)

(58) Field of Classification Search
CPC .... G02B 6/0068; G02B 6/0073; G02B 6/003; G02B 6/0083; G02B 6/0051; G02B 6/0055
See application file for complete search history.

(56) References Cited

U.S. PATENT DOCUMENTS 4,542,449 A    9/1985   Whitehead
4,791,540 A    12/1988  Dreyer, Jr. et al.
(Continued)

FOREIGN PATENT DOCUMENTS

JP    2010057092 A    3/2010
JP    2012142183 A    7/2012
(Continued)

OTHER PUBLICATIONS

International Search Report and Written Opinion for International Application No. PCT/US2016/041333, dated Oct. 4, 2016.
(Continued)

*Primary Examiner* — Anabel Ton
(74) *Attorney, Agent, or Firm* — Morgan, Lewis & Bockius LLP

(57) ABSTRACT

A lighting device includes a frame having an access panel. At least one LED is coupled to an interior edge of the frame and a light guide panel is positioned in the frame such that an edge is in communication with the LED. At least one light injection optic is coupled to the LED and the edge of the light guide panel, and is configured to direct light from the LED toward the edge of the light guide panel. At least one reflector is coupled to the LED, and is configured to direct light from the LED toward the edge of the light guide panel. At least one reflective sheet is coupled to a rear surface of the light guide panel and at least one color conversion sheet is coupled to a front surface of the light guide panel. A cover is coupled to the rear of the frame.

20 Claims, 8 Drawing Sheets

(51) Int. Cl.
*H01L 33/58* (2010.01)
*F21V 7/00* (2006.01)
*F21V 9/30* (2018.01)
*G09F 13/18* (2006.01)
*C09K 11/06* (2006.01)
*H05B 33/14* (2006.01)
*F21V 9/08* (2018.01)
*G09F 13/00* (2006.01)
*H05B 45/10* (2020.01)
*H01L 33/60* (2010.01)
*F21Y 115/10* (2016.01)
*H04R 1/02* (2006.01)
*H01L 33/50* (2010.01)
*F21Y 103/20* (2016.01)

(52) U.S. Cl.
CPC ............... *F21V 9/30* (2018.02); *G02B 6/003* (2013.01); *G02B 6/009* (2013.01); *G02B 6/0031* (2013.01); *G02B 6/0051* (2013.01); *G02B 6/0055* (2013.01); *G02B 6/0068* (2013.01); *G02B 6/0083* (2013.01); *G09F 13/00* (2013.01); *G09F 13/18* (2013.01); *H01L 33/58* (2013.01); *H05B 33/14* (2013.01); *H05B 45/10* (2020.01); *F21Y 2103/20* (2016.08); *F21Y 2115/10* (2016.08); *H01L 33/507* (2013.01); *H01L 33/60* (2013.01); *H04R 1/028* (2013.01)

(56) References Cited

U.S. PATENT DOCUMENTS

| | | |
|---|---|---|
| 4,799,131 A | 1/1989 | Aho et al. |
| 4,883,341 A | 11/1989 | Whitehead |
| 4,984,144 A | 1/1991 | Cobb, Jr. et al. |
| 6,600,175 B1 | 7/2003 | Baretz et al. |
| 7,070,300 B2 | 7/2006 | Harbers et al. |
| 7,151,283 B2 | 12/2006 | Reeh et al. |
| 7,639,916 B2 | 12/2009 | Fine |
| 8,128,272 B2 | 3/2012 | Fine et al. |
| 8,178,852 B2 | 5/2012 | Kingsley et al. |
| 8,232,533 B2 | 7/2012 | Kingsley et al. |
| 8,243,230 B2 * | 8/2012 | Oversluizen ............ H04N 5/72 349/63 |
| 8,415,642 B2 | 4/2013 | Kingsley et al. |
| 9,797,573 B2 | 10/2017 | Horner et al. |
| 2006/0255716 A1 | 11/2006 | Tsutsumi et al. |
| 2007/0047219 A1 | 3/2007 | Thompson et al. |
| 2008/0205035 A1 | 8/2008 | Asvadi et al. |
| 2008/0231170 A1 | 9/2008 | Masato et al. |
| 2008/0252198 A1 | 10/2008 | Katano et al. |
| 2009/0257242 A1 | 10/2009 | Wendman |
| 2009/0268273 A1 | 10/2009 | Powers et al. |
| 2010/0012959 A1 | 1/2010 | Wilm et al. |
| 2010/0014319 A1 | 1/2010 | Oversluizen et al. |
| 2010/0172122 A1 | 7/2010 | Ramer |
| 2010/0303409 A1 | 12/2010 | Ku et al. |
| 2011/0175527 A1 | 7/2011 | Ramer |
| 2011/0175546 A1 | 7/2011 | Ramer |
| 2011/0176291 A1 | 7/2011 | Sanders |
| 2011/0248287 A1 | 10/2011 | Yuan et al. |
| 2011/0267801 A1 | 11/2011 | Tong et al. |
| 2012/0080613 A1 | 4/2012 | Kingsley et al. |
| 2012/0087103 A1 | 4/2012 | Dai |
| 2012/0140126 A1 | 6/2012 | Werth |
| 2012/0155113 A1 | 6/2012 | Fine et al. |
| 2012/0301724 A1 | 11/2012 | Frauenrath et al. |
| 2013/0026504 A1 | 1/2013 | Marx et al. |
| 2013/0050979 A1 | 2/2013 | Van de Ven et al. |
| 2013/0088853 A1 | 4/2013 | Kingsley et al. |
| 2013/0175456 A1 | 7/2013 | Kingsley et al. |
| 2013/0215597 A1 | 8/2013 | Davis |
| 2013/0222543 A1 | 8/2013 | Bae et al. |
| 2014/0041572 A1 | 2/2014 | Schuler et al. |
| 2014/0191686 A1 | 7/2014 | Maxik et al. |
| 2014/0204281 A1 | 7/2014 | Maeda |
| 2014/0215872 A1 | 8/2014 | Dumond et al. |
| 2014/0376267 A1 | 12/2014 | Myers et al. |
| 2015/0041683 A1 | 2/2015 | Horner et al. |
| 2017/0171669 A1 * | 6/2017 | Billson ................. H04R 19/02 |
| 2018/0031205 A1 | 2/2018 | Horner et al. |

FOREIGN PATENT DOCUMENTS

| | | |
|---|---|---|
| KR | 28888847154 A | 5/2008 |
| KR | 20080063986 | 7/2008 |
| WO | 2005060309 A2 | 6/2005 |
| WO | 2006/129244 | 12/2006 |
| WO | 2010/030069 | 3/2010 |
| WO | 2012/120332 | 9/2012 |
| WO | 2013/023008 | 2/2013 |
| WO | 2013/035002 | 3/2013 |

OTHER PUBLICATIONS

Nobuaki Tanaka, et al., "Photodegradation of Polymer-Dispersed Perylene Di-imide Dyes," Applied Optics, vol. 45, No. 16, Jun. 1, 2006, pp. 3846-3851.

Office Action for European Patent Application No. 16821980.6 dated Jan. 15, 2019.

Office Action for Indian Patent Application No. 201817004592 dated Dec. 30, 2019.

* cited by examiner

LED PANEL LIGHTING SYSTEM

CROSS-REFERENCE TO RELATED APPLICATIONS

This application is a U.S. National Stage Entry of International Patent Application Serial No. PCT/US2016/041333 filed on Jul. 7, 2016, entitled "LED Panel Lighting System," which claims the benefit of U.S. Provisional Patent Application No. 62/190,163 filed on Jul. 8, 2015, entitled "LED Panel Lighting System," and U.S. Provisional Patent Application No. 62/193,020 filed on Jul. 15, 2015, entitled "LED Panel Lighting System," each of which is incorporated by reference herein in its entirety.

FIELD OF THE TECHNOLOGY

The technology generally relates to light emitting diode (LED) lighting systems, and in particular to LED panel lighting systems with improved light extraction efficiency, light quality, and design flexibility.

BACKGROUND OF THE TECHNOLOGY

Panel lighting systems for residential and commercial applications have increasingly utilized LEDs as a light source due to their high lumen output, decreased energy consumption, and extended life cycle compared to traditional light sources such as fluorescent or incandescent light bulbs. Conventional edge-lit LED panel lighting systems generally include a frame in which white LEDs emit light into the edge of a light guide having features to distribute and emit light for illuminating a room, corridor, or other area. The need for maximum utilization of energy drives the design of components and features that reduce optical losses.

Currently white LEDs are obtained through the down-conversion of a fraction of the blue light emitted from a blue LED chip to produce yellow light, which upon mixing with the remaining (unconverted) blue light yields a spectrum that appears white to the human eye. Conventional white LEDs typically use a coating containing one or more rare-earth-containing phosphors to realize such a color conversion.

However, the conventional implementation suffers from a variety of problems, including far-field color non-uniformity originating from poor control of phosphor dispersion, significantly reduced external quantum efficiency due to phosphor quenching and unfavorable scattering losses, poor color rendition capability of saturated red hues (termed R9), and high material cost at the required phosphor loading level, as well as high binning costs when the lighting application has a tight tolerance for color quality variations.

SUMMARY OF THE TECHNOLOGY

In an embodiment a lighting device includes a frame having a first edge; at least one light emitting diode and coupled to an interior of a second edge of the frame; a light guide panel positioned in the frame, an edge of the light guide panel in communication with the at least one light emitting diode; at least one reflective sheet coupled to a rear surface of the light guide panel; and at least one color conversion sheet coupled to a front surface of the light guide panel. In some embodiments the at least one light emitting diode includes a flat-top lens (and/or may exclude a domed lens). The light emitting diode may emit blue light. The at least one color conversion sheet may be configured to convert the blue light emitted by the at least one light emitting diode to a white light. The lighting device may further include a power supply coupled to the frame, the power supply providing power to the at least one light emitting diode, and in some cases may further include a dimming control coupled to the at least one light emitting diode and/or a proximity sensor and/or a light sensor coupled to one or more of the power supply and the dimming control. In some embodiments the lighting device may include a diffuser, which in some cases may be coupled to a front surface of the color conversion sheet. The lighting device may further include a reflective strip that is in communication with an edge of the light guide panel, wherein the edge of the light guide pane that is in communication with the reflective strip is not in communication with the blue light emitting diode.

In some embodiments the color conversion sheet comprises a first layer and a second layer, wherein the first layer comprises a first dye and the second layer comprises a second dye. The first dye may be configured to absorb light emitted by the at least one light emitting diode and the second dye may be configured to absorb light emitted by the first dye. In some embodiments, the first dye and second dye are each independently selected from the group consisting of rylenes, xanthenes, porphyrins, and phthalocyanines. In particular, in some embodiments the first dye and the second dye are each independently selected from the group consisting of 3-cyanoperylene-9,10-dicarboxylic acid 2',6'-diiso-sopropylanilide, 3,4,9,10-perylene tetracarboxylic acid bis (2,6-diisopropyl) anilide, 1,6,7,12-tetraphenoxy-N,N'-di(2, 6-diisopropylphenyl)-3,4:9,10-perylenediimide, Rhodamine B, Eosin Y, fluorescein, 5,10,15,20-tetraphenyl-21H,23H-tetraphenylporphine, and 2,3,7,8,12,13,17,18-octaethyl-21H,23H-porphine. In specific embodiments the yellow light emitting dye includes 3-cyanoperylene-9,10-dicarboxylic acid 2'6'-diisopropylanilide. In specific embodiments the green light emitting dye comprises diisobutyl 4,10-dicyanoperylene-3,9-dicarboxylate. In specific embodiments the red light emitting dye comprises 1,6,7,12-tetra-phenoxy-N—N'-di(2,6-diisopropylphenyl)-3,4:9,10-perylenediimide. In some embodiments the second layer comprises a yellow light emitting dye and the first layer comprises at least one of a green light emitting dye and a red light emitting dye. The second layer may be positioned between the first layer and the light guide panel.

In some embodiments a lighting device includes any or all of the features described above and further includes at least one light injection optic coupled to the at least one light emitting diode and the edge of the light guide panel, the at least one light injection optic configured to direct a first light emitted from the at least one light emitting diode into the edge of the light guide panel. The at least one light injection optic has a focal point and, in some embodiments, the at least one light emitting diode is positioned at the focal point of the at least one light injection optic. The at least one light injection optic may include a lens or a mirror. In some embodiments the at least one light injection optic is a mirror having a pyramidal structure having a base, which may be oriented parallel to the second edge of the frame. In some embodiments the at least one light injection optic is a mirror having a conical structure having a base. In some embodiments the at least one light injection optic comprises an array of light injection optics. In some embodiments where the at least one light injection optic comprises an array of light injection optics, the at least one light emitting diode includes a plurality of light emitting diodes, wherein the array of light injection optics comprises a light injection optic for each of the plurality of blue light emitting diodes. In other embodiments the at least one light injection optic consists of a single light injection optic having a base that extends a length of the second edge of the frame.

In some embodiments a lighting device includes any or all of the features described above and further includes a driver configured to modulate intensity of a light emitted from the lighting device at a rate of about 20 to about 70 MHz. In such embodiments the at least one color conversion sheet may include a dye having a fluorescence lifetime of about 5 ns or less. Such a lighting device may be configured to function as a wireless communication device.

In some embodiments a lighting device includes any or all of the features described above and further includes a color neutralization device for neutralizing a color of the at least one color conversion sheet.

The color neutralization device may be configured to reduce an amount of ambient light interacting with the at least one color conversion sheet. In such embodiments, the color neutralization device may comprise a shutter. In a specific embodiment, the color neutralization device may further comprise a power source, wherein the shutter is in electronic communication with the power source and is configured to mechanically close in response to the power source not providing power. In another specific embodiment, the color neutralization device may further comprise a power source, wherein the shutter is in electronic communication with the power source and is configured to appear opaque in response to a power source not providing power.

The color neutralization device may be configured to reduce the amount of converted yellow light emitted from a front surface of the lighting device. In such embodiments, the color neutralization device may comprise a gasket configured to provide an air gap between one or more of the at least one color conversion sheet and the light guide panel, the light guide panel and the at least one reflective sheet, and a diffuser and the at least one color conversion sheet. In other embodiments where the color neutralization device is configured to reduce the amount of converted yellow light emitted from a front surface of the lighting device, the color neutralization device includes an electrophoretic display configured to change a color of the at least one reflective sheet. In still other embodiments the color neutralization device is configured to redirect converted yellow light away from a line of sight of a viewer. For example, the color neutralization device may include at least one light direction control optic configured to direct ambient light reflected from the at least one color conversion sheet at an angle substantially greater than an angle of dispersion of light emitted from the lighting device.

The color neutralization device may be configured to provide additional blue light to neutralize a yellow color of the lighting device when the at least one light emitting diode is off. In such an embodiment, the color neutralization device may include a power limiting circuit or limited power source configured to limit the power provided to the at least one light emitting diode from one or more of a battery and a second power supply. A power limiting circuit or limited power source may provide sufficient power to the at least one light emitting diode to stimulate emission of white light from a photoluminescent component in the at least one color conversion sheet sufficient to neutralize a color of the at least one color conversion sheet.

In some embodiments a lighting device includes any or all of the features described above and further includes, wherein the first edge comprises an access panel. In some embodiments a lighting device may further comprise a hinge connecting the access panel to the frame, while in other embodiments the access panel comprises one or more removable fasteners connecting the access panel to the frame, or both one or more removable fasteners connecting the access panel to the frame and a hinge connecting the second edge to the frame. In some embodiments wherein the first edge comprises an access panel, one or more of the light guide panel, the at least one reflective sheet, and the at least one color conversion sheet may be configured to be removed from the lighting device via the access panel without otherwise disassembling the frame.

In some embodiments a lighting device includes any or all of the features described above and may further include a stability enhancement layer. In some embodiments the stability enhancement layer may include polyvinyl alcohol, ethylene vinyl alcohol copolymers, polyvinyl chloride, polyvinylidene chloride copolymers (saran), nylons, acrylonitriles, polyethylene terephthalate polyester, polyethylene naphthalate, polytrimethyl terephthalate, liquid crystal polymers, transparent inorganic oxide coatings, nanocomposites, oxygen scavengers, aromatic polyketones and any combinations or blends thereof. In some embodiments the stability enhancement layer may comprise a singlet oxygen quencher. In some embodiments the color conversion sheet may comprise a singlet oxygen quencher. A singlet oxygen quencher for use in a stability enhancement layer and/or a color conversion sheet may include 2,2,6,6-tetramethyl-4-piperidone, 1,4-diazabicyclo[2.2.2]octane, or diphenylsulfide.

In some embodiments a lighting device includes any or all of the features described above and may be used for an audio device, which may include a speaker. In such embodiments, the light guide panel may define a light guide panel hole, and/or the at least one color conversion sheet may define a color conversion sheet hole, wherein the light guide panel and/or the at least one color conversion sheet are positioned such that the light guide panel hole and/or the color conversion sheet hole are aligned with the speaker. The lighting device for an audio device may further include an acoustic scrim. The lighting device for an audio device may further include a first layer of a first ink, wherein the first ink comprises a first photoluminescent dye. The first layer of the first ink may define an image or pattern. The first layer of the first ink may be adhered to the at least one color conversion sheet; alternatively, the first layer of the first ink may be adhered to the acoustic scrim.

In an embodiment, a method of making an edge-lit light emitting diode sign includes: providing: a frame having a first edge; at least one blue light emitting diode coupled to an interior of a second edge of the frame; a light guide panel positioned in the frame, an edge of the light guide panel in communication with the at least one blue light emitting diode; at least one reflective sheet coupled to a rear surface of the light guide panel; and at least one color conversion sheet coupled to a front surface of the light guide panel; and printing an image on the at least one color conversion sheet with an ink comprising a photoluminescent dye.

Embodiments of the technology described herein are directed to LED panel lighting systems including features that overcome deficiencies of conventional LED panel lighting systems.

In one aspect, the technology relates to a lighting device including various combinations of features. The lighting devices can includes a frame having a first edge with an access panel and at least one light emitting diode coupled to an interior of a second edge of the frame. The lighting device can further include a light guide panel positioned in the frame. An edge of the light guide panel is in communication with the at least one light emitting diode. The lighting device can further include at least one light injection optic coupled to the at least one light emitting diode and the edge of the light guide panel. The at least one light injection optic is configured to direct a first light emitted from the at least one light emitting diode toward the edge of the light guide panel. The lighting device can further include at least one reflector coupled to the at least one light emitting diode. The at least one reflector is configured to direct a second light emitted from the at least one light emitting diode toward the edge of the light guide panel. The lighting device can further include at least one reflective sheet coupled to a rear surface of the light guide panel and at least one color conversion sheet coupled to a front surface of the light guide panel. The lighting device can further include a cover coupled to a rear of the frame.

In some embodiments, the lighting device further includes various combinations of features. The lighting device can include a power supply coupled to the frame. The power supply provides power to the at least one light emitting diode. The lighting device can further include a dimming control coupled to the at least one light emitting diode. The lighting device can further include a proximity sensor coupled to one or more of the power supply and the dimming control. The lighting device can further include a wireless communication device coupled to one or more of the frame, the power supply, the dimming control, and the proximity sensor. The wireless communication device is configured to communicate with one or more of a remote lighting controller and a wireless communications device of a second lighting device. The lighting device can further include a color neutralization device for neutralizing a color of the at least one color conversion sheet. The color neutralization device can include one or more of (i) a power limiting circuit or a limited power source configured to affect the off-state color by providing power to the at least one light emitting diode from a battery or second power supply, (ii) a closeable shutter configured to conceal the at least one color conversion sheet, (iii) a gasket configured to provide an air gap between one or more of the color conversion sheet and the light guide panel, the light guide panel and the reflective sheet, and a diffuser and the color conversion sheet, (iv) at least one light direction control optic configured to direct a third light (e.g., an ambient light) reflected from the color conversion sheet at an angle substantially greater than a viewing angle of light emitted from the system, and (v) an electrophoretic display configured to change a color of the reflective sheet.

In some embodiments, the lighting device is configured to provide light for illuminating the premises of a commercial building. In some embodiments, the lighting device is configured for replacing or retrofitting an existing lighting device based on an incandescent, fluorescent, or halogen light source. In some embodiments, the lighting device can be configured to provide graphical or image display as for signage. In some embodiments, the lighting device is configured to provide surface illumination, including graphical or image display, for an acoustical system. In some embodiments, the lighting device is configured as a fixture for providing light to an interior of an automobile. In some embodiments the lighting device is configured as a fixture for providing light to an interior of a boat or other transportation vehicle.

Other aspects of the technology will become apparent from the following detailed description, taken in conjunction with the accompanying drawings, illustrating the principles of the technology by way of example only.

BRIEF DESCRIPTION OF THE DRAWINGS

The foregoing and other objects, features, and advantages of the presently-described technology as well as the technology itself, will be more fully understood from the follow description of various embodiments, when read together with the accompanying drawings.

DETAILED DESCRIPTION

The technology described herein relates to LED panel lighting systems and applications thereof. Using the components and configurations described below, an LED panel lighting system can be constructed to accommodate a wide variety of lighting system applications. For example, the LED panel lighting system can be configured for use in large form factor lighting systems (e.g., lighted billboards, commercial lighting), as well as small form factor lighting systems (e.g., retrofit lamps, automotive interior lighting).

Figure 1:
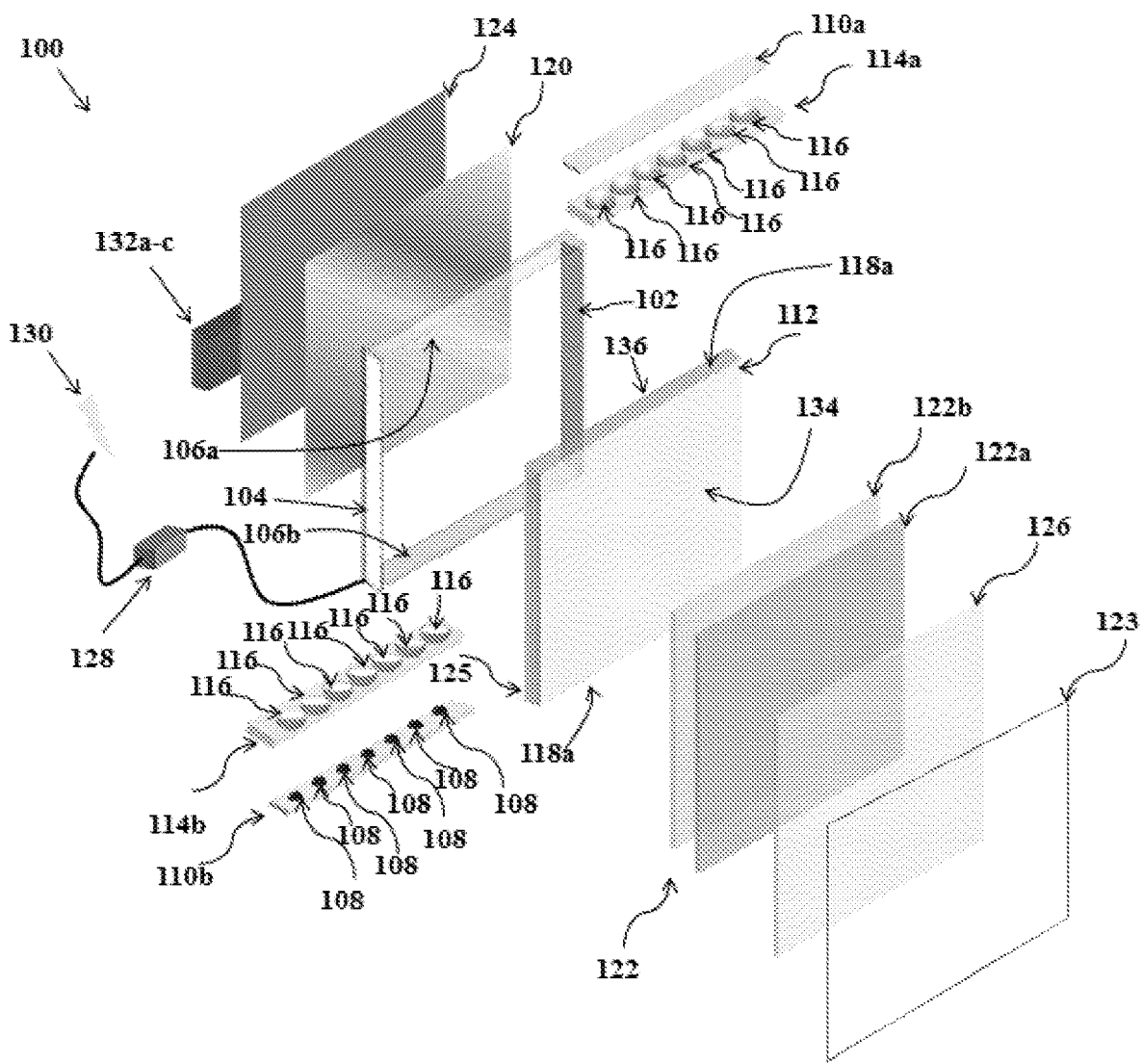
FIG. 1 is an exploded perspective view of an LED panel lighting system according to embodiments of the technology described herein.

FIG. 1 is an exploded perspective view of an LED panel lighting system 100 ("system 100") according to embodiments of the technology described herein. System 100 includes a fixture frame 102 for housing and/or mounting the various components of system 100 and a cover 124 coupled to the rear of fixture frame 102 to secure the various components of system 100 in fixture frame 102.

Fixture frame 102 can include features for mounting the components of system 100. For example, the interior edges of fixture frame 102 can include grooves or other features configured to position the various components of system 100 within fixture frame 102. Fixture frame 102 can be any LED panel frame or lightbox known in the art. In some embodiments, fixture frame 102 is a rectangular frame having four planar edges.

Cover 124 can be a metal or plastic panel with tabs or other attachment features for coupling cover 124 to fixture frame 102. In some embodiments, cover 124 includes mounting features to facilitate securing system 100 to a surface such as a ceiling or wall.

In some embodiments, fixture frame 102 includes an access panel 104 configured to enable access to the components of system 100 mounted inside of fixture frame 102. Access panel 104 is discussed in more detail below with respect to FIGS. 2A-2E.

System 100 further includes at least one LED 108 as a light source, and power supply 128 for providing power to the at least one LED 108 in addition to other components of system 100 discussed below. Power supply 128 can be any power converter for converting a line voltage 130 to a DC voltage that can be used to power the components of system 100. In some embodiments, line voltage 130 is an AC power source, and power supply 128 is an AC to DC converter. In some embodiments, line voltage 130 is a DC power source, and power supply 128 is a DC to DC converter.

LED 108 can be a blue LED that emits light having a wavelength substantially in the range of 440-495 nm. In some embodiments, at least one LED 108 is mounted to a carrier such as a rigid, flexible, or semi-flexible printed circuit board to form an LED strip that can be mounted to an interior edge of fixture frame 102. For example, as shown in FIG. 1, LED strip 110b includes seven LEDs 108 arranged in a single row with a fixed distance between each LED 108. (LED strip 110a likewise includes seven LEDs 108, however the perspective angle of FIG. 1 shields them from view.) It should be appreciated that any number and/or color of LEDs, arranged on a variety of carriers in a variety of circuit configurations (e.g., series-connected LEDs, parallel-connected LEDs) can be used without departing from the scope of the technology.

In some embodiments LED 108 comprises a lens, such as a domed lens or a flat lens. Preferably, LED 108 comprises a flat-top lens. A domed lens in LED 108 may interfere with the ability to inject light from the LED into a light guide panel 112. For example, a wider angle of divergence of light emitted from the LED requires a shorter preferable distance between the LED 108 and the light guide panel 112, in order to maximize the number of photons emitted from the LED 108 and injected into the light guide panel 112. A domed lens may limit the number of photons that can be injected into the light guide panel by limiting the proximity between the LED 108 and the light guide panel 112. In some embodiments LED 108 comprises a flat-top lens and the lighting device 100 is configured to obtain greater than 90% efficiency of capture of light emitted from the LED 108 into the light guide panel 112. In some embodiments LED 108 comprises a flat-top lens and the lighting device 100 is configured to obtain greater than 70% efficiency of capture of light emitted from the LED 108 into the light guide panel 112.

The efficiency of the capture of light into light guide panel 112 may depend on characteristics of LED 108 (e.g. the angle of dispersion of light emitted) as well the configuration of LED 108 and light guide panel 112 (e.g. the ratio of the distance between LED 108 and light guide panel 112 to the thickness of the light guide panel 112). In some embodiments system 100 can achieve greater than 90% efficiency of capture of light emitted from the LED 108 into the light guide panel 112 where the ratio of the distance between the LED 108 and the light guide panel 112 to the thickness (i.e. width of the edge) of the light guide panel 112 is no greater than 1:10, no greater than 1:8, no greater than 1:6, no greater than 1:5, or no greater than 1:4. In some such embodiments LED 108 may include a flat-top lens. In some embodiments the system 100 is configured to obtain greater than 70% efficiency of capture of light emitted from the LED 108 into the light guide panel 112, where the ratio of the distance between the LED 108 and the light guide panel 112 to the thickness (i.e. width of the edge) of the light guide panel 112 is no greater no greater than 1:6, no greater than 1:5, or no greater than 1:4, no greater than 1:3, no greater than 1:2.5, or no greater than 1:2. In some such embodiments LED 108 may include a flat-top lens.

LED strips 110 can be mounted to an interior edge of fixture frame 102. For example, LED strip 110a can be mounted to interior edge 106a of fixture frame 102. Likewise, LED strip 110b can be mounted to interior edge 106b of fixture frame 102.

System 100 further includes light guide panel 112, color conversion sheet 122, and reflective sheet 120 mounted inside fixture frame 102, with color conversion sheet 122 disposed in front of light guide panel 112, and reflective sheet 120 disposed behind light guide panel 112, where front refers to a position closer to an end viewer, or the direction in which light emittance is maximized, and behind refers to a position farther from an end viewer and opposed to the front.

Light guide panel 112 is a rectangular panel formed of a transparent or translucent material such as acrylic configured to distribute and emit light emitted by LEDs 108. For example, light guide panel 112 is positioned in fixture frame 102 such that edge 118a is substantially adjacent to the light emitted by LEDs 108 of LED strip 110a, and edge 118b is substantially adjacent to the light emitted by LEDs 108 of LED strip 110b. Light emitted from LEDs 108 enters edges 118 and is distributed throughout light guide panel 112. The light guide panel 112 typically incorporates a pattern of features designed to scatter guided optical modes of light transmission such that they are emitted from a front face 134 of light guide panel 112 to provide illumination. In some embodiments, a pattern of features is provided by surface deformation, such as etching. In other embodiments, a pattern of features is provided by embossing, molding, or otherwise including discrete prismatic structures within the light guide panel 112. In still other embodiments, a pattern of features is provided by printing a thin layer of coating material onto the desired areas of the light guide panel 112. The coating material may have substantially the same refractive index as the light guide panel 112 and one or more light scattering materials substantially dispersed therein.

Reflective sheet 120 is formed of a reflective film or foil, and redirects any light emitted from a rear face 136 of light guide panel 112 toward front face 134. An intimate contact between the reflective sheet 120 and the back surface of light guide panel 112 (side farther from viewer) is preferred. The reflective sheet 120 can be attached to the back surface of the light guide panel 112 by applying a thin and/or fine line of non-absorbing adhesive running along the circumference of the back surface of the light guide panel 112. The adhesive should be selected to not interfere with light guide panel extraction patterns.

In embodiments where at least one edge of the light guide panel 112 is not in communication with one or more LEDs 108, an edge reflective strip 125 can be attached to or in communication with an edge of the light guide panel 112 where no LEDs 108 are distributed. This reflective strip may prevent photons propagating within the light guide panel 112 from escaping from the edges where no LEDs 108 are distributed. Edge reflective strip 125 is formed of a reflective film or foil.

In some embodiments, at least one light injection optic 116 is positioned between LED 108 and an edge 118 of light guide panel 112 to direct light emitted from LED 108 into light guide panel 112 more efficiently than in conventional LED panel lighting systems. For example, light injection optic 116 can be a cylindrical lens or other refractive optic capable of directing light emitted by LED 108 into light guide panel 112 at angles that facilitate the light being guided out of front face 134 rather than escaping near an edge of light guide panel 112. In some embodiments light injection optic 116 directs light emitted by LED 108 into light guide panel 112 by collimating or focusing light emitted by LED 108 into light guide panel 112.

In some embodiments, at least one light injection optic 116 is mounted to a carrier to form a light injection strip 114 that can be respectively mounted between LED strip 110 and edge 118 of light guide 112. As shown in FIG. 1, light injection strip 114a includes seven light injection optics 116 arranged in a single row with a fixed distance between each light injection optic 116. The fixed distance between each light injection optic 116 is chosen to substantially align one light injection optic 116 with each LED 108 of an LED strip 110. In some embodiments the light injection optics 116 are molded into edges 118 of light guide panel 112. Alternatively, such a light injection optic 116 can be designed as a lens (e.g. a cylindrical lens) that acts on two or more LEDs. In still another embodiment, such a light injection optic 116 can be designed as a single lens (e.g. a cylindrical lens) that acts collectively on the array of LEDs 108 arranged near the edge of the light guide 112 to inject light from the LEDs into the light guide 112.

In some embodiments, the use of a light injection optic 116 comprising a refractive optical component between LEDs and the edge 118 of light guide panel 112 may increase the distance between the LED and the edge 118 of the light guide panel 112. In such embodiments, whether or not the refractive optical component should be included can be determined by considering the angle of dispersion of the primary light emission from the LEDs. If the angle of dispersion of the LEDs is sufficiently acute, e.g., about 160° or less, about 140° or less, about 120° or less, or about 100° or less, a smaller distance between the LEDs and edge of the light guide is preferred, such that no refractive optical component would be positioned between the LED and the edge of the light guide panel. In some embodiments the preferred distance between the LED and the edge of the light guide is about 10 mm or less, about 5 mm or less, about 2 mm or less, about 1 mm or less, about 0.75 mm or less, about 0.5 mm or less, about 0.25 mm or less. about 0.1 mm or less, or about 0.05 mm or less. In some embodiments the preferred distance between the LED and the edge of the light guide is about 0.1 mm to about 5 mm, about 0.1 mm to about 2 mm, about 0.1 mm to about 1 mm, about 0.01 mm to about 1 mm, about 0.01 mm to about 0.05 mm, or about 0.01 mm to about 0.1 mm.

System 100 can include components for improving the light output of system 100 by increasing the number of light photons emitted from LEDs 108 that are injected into light guide panel 112 and ultimately collected and converted by color conversion sheet 122. For example, a reflector can be positioned behind (e.g., underneath) and around each of LED strips 110 to collect light, including both primary light from LEDs 108 and secondary light arising from light scattering/reflection from optical surfaces, that would otherwise be lost from being outside of the entrance pupil to light guide panel 112 or due to back-reflection from the entrance edge of light guide panel 112, and instead direct this light into light guide panel 112 at angles that benefit total internal reflection of the injected light.

Figure 3A:
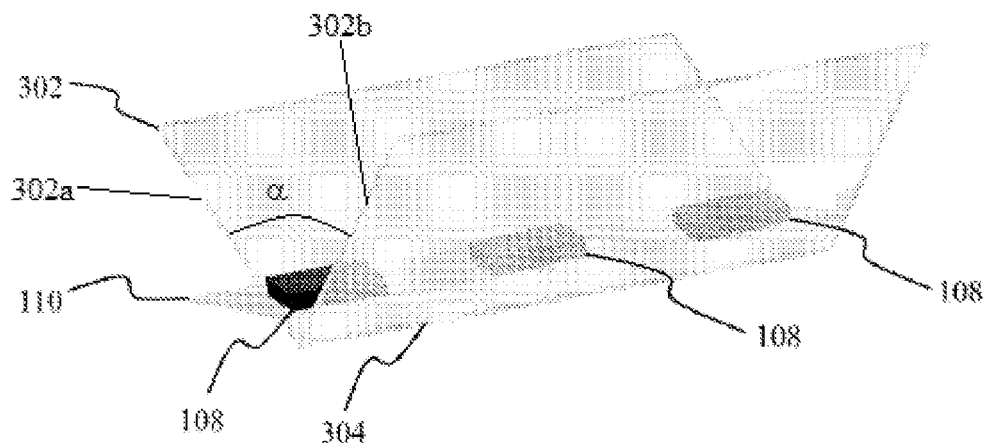
FIG. 3A is a perspective view of a v-groove reflector for reflecting light emitted by an LED according to embodiments of the technology described herein.

FIG. 3A is a perspective view of a v-groove reflector 302 for reflecting light emitted by LEDs 108 according to embodiments of the technology described herein. As shown in FIG. 3A, LED strip 110 is positioned at or near vertex 304 such that the reflective surfaces of v-groove reflector 302 are positioned substantially behind and around the LEDs 108 of LED strip 110. Accordingly, the reflective surfaces of v-groove reflector 302 direct light photons emitted from the bottom and sides of LEDs 108 substantially toward edge 118 of light guide panel 112, which is positioned adjacent to LEDs 108 as described above. In embodiments of system 100 including at least one light injection optic 116, the reflective surfaces of v-groove reflector 302 direct light photons emitted from the bottom and sides of LEDs 108 substantially toward the at least one light injection optic 116. V-groove reflector 302 can have a first arm 302a and a second arm 302b with an angle α between the first arm 302a and second arm 302b of about 45°, about 50°, about 55°, about 60°, about 65°, about 70°, about 75°, about 80°, about 85°, about 90°, about 95°, about 100°, about 105°, about 110°, about 115°, about 120°, about 125°, about 130°, about 135°, or about 140°. V-groove reflector 302 can have a first arm 302a and a second arm 302b with an angle α between the first arm 302a and second arm 302b in a range of about 45° to about 60°, about 55° to about 70°, about 60° to about 75°, about 70° to about 85°, about 75° to about 90°, about 80° to about 95°, about 90° to about 105°, about 95° to about 110°, about 105° to about 120°, about 110° to about 125°, about 120° to about 135°, or about 125° to about 140°. In some embodiments a single v-groove reflector 302 is provided for LED strip 110. In some embodiments individual v-groove reflectors 302 are provided for each of LEDs 108. In some embodiments LED 108 or LED strip 110 is placed at the vertex of v-groove reflector 302.

In cases where the use of an optical reflector positioned between or extending between LEDs 108 and the edge 118 of the light guide panel 112 increases the distance between LED 108 and the edge 118 of the light guide panel 112, whether or not the optical reflector should be included can be determined as described above for an optical refractive optical component. That is, whether or not a light injection component 116 comprising a reflector that is positioned or extends between LED 108 and the edge 118 of light guide panel 112 should be included can be determined by considering the angle of dispersion of the primary light emission from the LEDs 108. If the angle of dispersion of the LEDs 108 is sufficiently acute, e.g. about 160° or less, where angle of dispersion is, two times the off-axis angle where the LED's luminous intensity is half the intensity at direct on-axis view, about 140° or less, about 120° or less, or about 100° or less, a smaller distance between the LEDs 108 and edge 118 of the light guide panel 112 is preferred, such that no reflective optical component would be positioned or extend between the LED and the edge of the light guide panel.

Figure 3B:
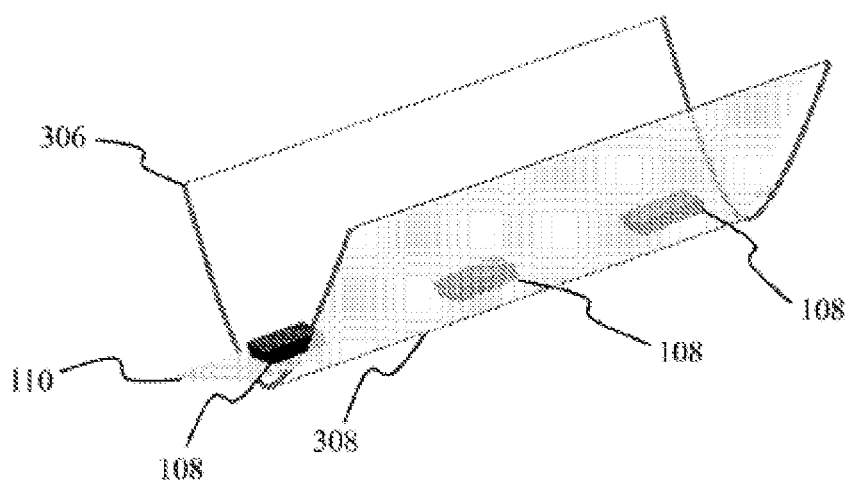
FIG. 3B is a perspective view of a parabolic reflector for reflecting light emitted by an LED according to embodiments of the technology described herein.
Figure 3C:
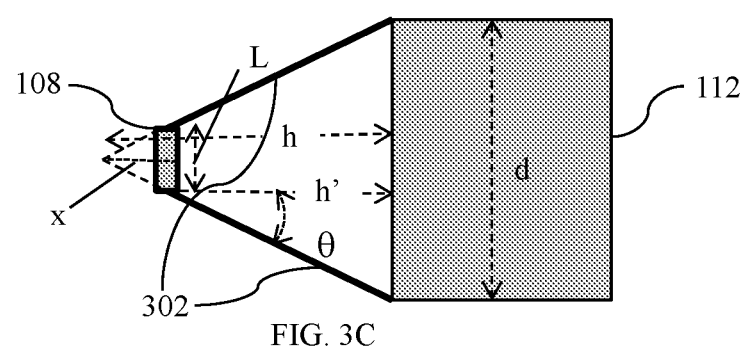
FIG. 3C is a side view of a truncated v-groove reflector for reflecting light emitted by an LED according to embodiments of the technology described herein.

In some embodiments LED strip 110 is positioned at vertex 304; however in other embodiments v-groove reflector 302 does not extend to a vertex, but rather forms a truncated prism, as shown in FIG. 3C. As shown in FIG. 3C, in some embodiments the truncated v-groove reflector 302 can be described as having a maximum width, d, defined by the width of the light guide panel 112 and a minimum width, L, defined by the width of LED 108. Since the reflector should ideally intersect the edges of the LED 108 and the light guide panel 112, the distance of the LED, h', relative to the total height of the truncated groove reflector 304, h, is defined by the ratio of the width of LED 108, L, to the width of the light guide panel 112, d:

$$\tfrac{1}{2}L/x = \tfrac{1}{2}d/h = \tan\theta$$

Such that $$L/d = x/h = (h-h')/h$$

Or, rearranging, $$h'/h = 1-(L/d).$$

In some embodiments, the v-groove reflector 302 may be designed as isolated elements and inject light from each emitter individually, with a single v-groove reflector corresponding to a single LED. In such embodiments each reflector can have a pyramidal structure, with the base of the pyramid aligning with the edge of the light guide. In some embodiments adjacent pyramidal v-groove reflectors would share an edge of their bases, as shown for light injection optic 116 in FIG. 1.

FIG. 3B is a perspective view of a parabolic reflector 306 for reflecting light emitted by an LEDs 108 according to embodiments of the technology described herein. As shown in FIG. 3B, LED strip 110 is positioned at or near vertex 308 such that the reflective surfaces of parabolic reflector 306 are positioned substantially behind and around the LEDs 108 of LED strip 110. Accordingly, the reflective surfaces of parabolic reflector 306 direct light photons emitted from the bottom and sides of LEDs 108 substantially toward edge 118 of light guide panel 112, which is positioned adjacent to LEDs 108 as described above. In embodiments of system 100 including at least one light injection optic 116, the reflective surfaces of parabolic reflector 306 direct light photons emitted from the bottom and sides of LEDs 108 substantially toward the at least one light injection optic 116. In some embodiments, the shape of the parabola and the distance of the LED 108 from the edge of the light guide panel 112 are defined by the width of the light guide panel 112, d, and the width of the LED, L. Preferably, the parabolic reflector 306 will intersect the edges of both the light guide panel 112 and the LED 108. Preferably the LED 108 is placed at the focus of the parabolic reflector 306. Where the parabolic reflector 306 intersects the edges of both the light guide panel 112 and the LED 108, and where the LED 108 is positioned at the focus of the parabolic reflector 306, the distance of the LED 108 from the edge of the light guide, h' is given by:

$$h' = (d^2-L^2)/(4L)$$

In some embodiments a single parabolic reflector 306 is provided for LED strip 110. In some embodiments individual parabolic reflectors are provided for each of LEDs 108. In some embodiments LED 108 or LED strip 110 is placed at the focal point of parabolic reflector 306.

In some embodiments, the parabolic reflector 306 may be designed as isolated elements and inject light from each emitter individually, with a single parabolic reflector corresponding to a single LED. In such embodiments each reflector can have a conical structure.

The v-groove reflector 302, including the truncated v-groove reflector, and parabolic reflector 306 respectively shown in FIGS. 3A, 3C, and 3B can comprise materials such as metals or plastics, and can be formed by any of several manufacturing processes known in the art such as casting, injecting molding, and extrusion. In some embodiments, the reflector is formed from plastic that is coated in a secondary process with a material such as aluminum, silver, metal alloy, reflective film, or any other reflective material. In some embodiments, the reflector is formed from uncoated white plastic. In some embodiments, the reflector further includes endwalls (not shown in FIG. 3A, FIG. 3B, and FIG. 3C).

Advantages provided by the reflectors described above can be best illustrated by way of a comparison between the extraction efficiency achieved by conventional LED panel lighting systems and the system 100 described herein. Extraction efficiency is expressed as a percentage according to the ratio of the radiant power of the light extracted (e.g., emitted) from a lighting system (e.g., system 100) to the radiant power emitted by the lighting system's light source (e.g., LEDs 108). In conventional LED panel lighting systems, the extraction efficiency can be 80% to as low as 30%. Based on the configuration of system 100, and the components used to assemble system 100 such as color conversion sheet 122, system 100 can have an extraction efficiency substantially greater than 80%. Further, in embodiments of system 100 that include a reflector such as v-groove reflector 302 and parabolic reflector 306 described above, extraction efficiency can be as high as 90-95%. Accordingly, the use of such reflectors allows system 100 to consume less power since a larger percentage of the light emitted from LEDs 108 contributes to the radiant power output of system 100.

Color conversion sheet 122 is an energy conversion structure that can convert light emissions of short wavelengths, such as those emitted by electroluminescent devices (e.g., LEDs 108), to one or more longer wavelengths. Color conversion sheet 122 is positioned in front of front face 134 of light guide panel 112 to convert the wavelength of the light emitted from LEDs 108 into one or more wavelengths of light that will be emitted from system 100. For example, color conversion sheet 122 can convert light having a substantially blue color to light having a substantially white color. Color conversion sheet 122 can be rendered as a cast, coated, injection-molded, or extruded sheet, planar or otherwise, generally including one or more layers comprising one or more photoluminescent (e.g. phosphorescent or fluorescent) materials such as organic fluorescent dyes. In some embodiments, color conversion sheet 122 is a color conversion structure according to embodiments described in U.S. Pat. Nos. 8,415,642 and 8,664,624, the contents of which are incorporated herein by reference in their entireties.

In some embodiments a color conversion sheet comprises a first layer comprising or consisting essentially of a first matrix and a first photoluminescent material. In some embodiments a color conversion sheet further comprises a second layer comprising or consisting essentially of a second matrix and a second photoluminescent material. The first and second matrices may comprise or consist essentially of the same material, or in some embodiments may comprise or consist essentially of distinct materials. The first photoluminescent material may be characterized by a first Stokes shift and a first radiation absorption structure and the second photoluminescent material may be characterized by a second Stokes shift and a second radiation absorption spectrum. Preferably, the second absorption spectrum at least partially overlaps with the first radiation spectrum.

The matrix into which the dyes are dispersed can comprise of polymers or glasses. Polymers are particularly useful due to the greater range of available materials from which to sub-select so as to form a homogeneous mixture of the photoluminescent material and the polymer. Acceptable polymers include acrylates, polyurethanes, polycarbonates, polyvinyl chlorides, silicone resins, and other common polymers. Materials with glass transition temperatures above the normal operating temperature of the material are particularly useful. The polymer matrix is preferably capable of preventing aggregation of the photoluminescent material, that is creating a homogeneous mixture of the photoluminescent material and the polymer, or a solid state solution of the photoluminescent material and polymer.

The photoluminescent materials used in the color conversion sheet of the lighting system described herein are selected based on their absorption and emission properties, with preference given to materials with high quantum yields. Preferably, the color conversion sheet comprises one or more photoluminescent (e.g. phosphorescent or fluorescent, in particular organic fluorescent) dyes. These dyes include, but are not limited to, rylenes, xanthenes, porphyrins, phthalocyanines, and others with high quantum yield properties. Rylene dyes are particularly useful. Rylene dyes include, but are not limited to, perylene ester and diimide materials, such as 3-cyanoperylene-9,10-dicarboxylic acid 2',6'-diiosopropylanilide, 3,4,9,10-perylene tetracarboxylic acid bis(2,6-diisopropyl) anilide and 1,6,7,12-tetraphenoxy-N,N'-di(2,6-diisopropylphenyl)-3,4:9,10-perylenediimide for example. Xanthene dyes include, but are not limited to, Rhodamine B, Eosin Y, and fluorescein. Porphyrins include, for example, 5,10,15,20-tetraphenyl-21H,23H-tetraphenylporphine and 2,3,7,8,12,13,17,18-octaethyl-21H,23H-porphine.

Figure 4A:
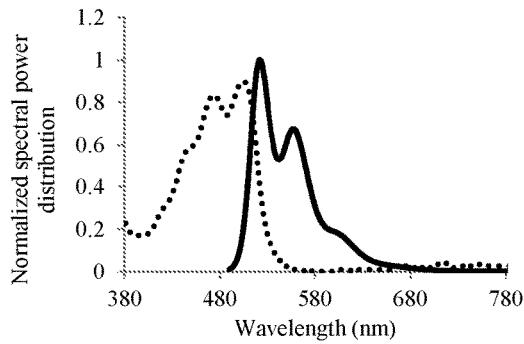
FIG. 4A illustrates the normalized spectral power distribution by wavelength in nm of the absorption spectrum (dashed line) and the radiation spectrum in (solid line) for a yellow luminescent dye.
Figure 4B:
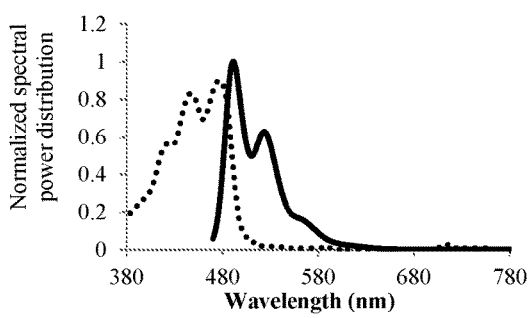
FIG. 4B illustrates the normalized spectral power distribution by wavelength in nm of the absorption spectrum in dashed lines and the radiation spectrum in solid line for a red luminescent dye.
Figure 4C:
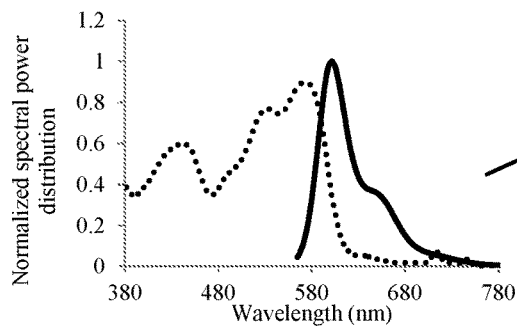
FIG. 4C illustrates the normalized spectral power distribution by wavelength in nm of the absorption spectrum in dashed lines and the radiation spectrum in solid line for a green luminescent dye.
Figure 4D:
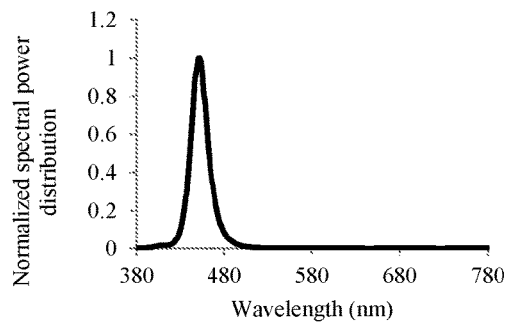
FIG. 4D illustrates the normalized spectral power distribution by wavelength in nm of the radiation spectrum in solid line for a blue light emitting diode.
Figure 4E:
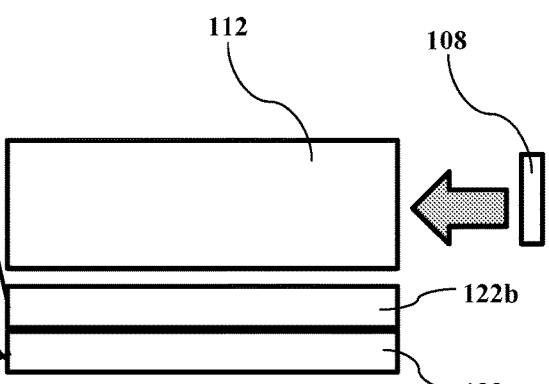
FIG. 4E is a side view of a lighting panel system in accordance with an embodiment of the invention.

In some embodiments a photoluminescent material (e.g. a phosphorescent or fluorescent dye) emits light having a longer wavelength than the light absorbed by the photoluminescent material, as illustrated in FIGS. 4A-4C. In FIGS. 4A-4C, dotted lines represent the absorption spectrum for a given dye and solid lines represent the emission spectrum for a given dye. For example, a photoluminescent (e.g. phosphorescent or fluorescent) dye may absorb blue light (e.g. in a range of about 450 nm to about 495 nm) and emit green light (e.g. in a range of about 495 nm to about 570 nm), yellow light (e.g. in a range of about 570 nm to about 590 nm), orange light (e.g. in a range of about 590 nm, to about 620 nm) and/or red light (e.g. in a range of about 620 nm to about 750 nm). In some embodiments a photoluminescent (e.g. phosphorescent or fluorescent) dye may absorb green light (e.g. in a range of about 495 nm to about 570 nm) and emit yellow light (e.g. in a range of about 570 nm to about 590 nm), orange light (e.g. in a range of about 590 nm to about 620 nm), and/or red light (e.g. in a range of about 620 nm to about 750 nm). In some embodiments a photoluminescent (e.g. phosphorescent or fluorescent) dye may absorb yellow light (e.g. in a range of about 570 nm to about 590 nm), and emit orange light (e.g. in a range of about 590 nm to about 620 nm) and/or red light (e.g. in a range of about 620 nm to about 750 nm). In some embodiments a photoluminescent (e.g. phosphorescent or fluorescent) dye may absorb orange light (e.g. in a range of about 590 nm to about 620 nm) and emit red light (e.g. in a range of about 620 nm to about 750 nm).

In some embodiments a photoluminescent (e.g. phosphorescent or fluorescent) dye may have an absorption spectrum that such that the photoluminescent (e.g. phosphorescent or fluorescent) dye can absorb more than one color of light. For example, in some embodiments a photoluminescent (e.g. phosphorescent or fluorescent) dye may absorb light in a range of from about 380 nm to about 520 nm, about 380 nm to about 560 nm, or about 380 to about 600 nm.

In some embodiments, it is desirable that the color conversion panel 122 and/or system 100 produce white light. The generation of white light from a blue source entails the creation of green, yellow, and red spectral components from the blue source. The proper combination of these components can lead to white light, with the quality characteristics, such as correlated color temperature (CCT) and color rendering index (CRI) defined by the amount of each spectral component included in the combined spectrum. The dyes used in these constructions absorb incident light and emit their fluorescence isotropically (in all directions). These dyes do not absorb blue light equally, but can be part of an energy cascade to shift generally shorter wavelengths to longer wavelengths, with each shorter wavelength emission being absorbed, to some extent, by a dye responsible for a longer wavelength spectral component. For example, as a result, green light, generated by a green-emitting dye, will have a tendency to be absorbed by a yellow emitter to be converted to yellow light. Such conversion will in turn reduce the color temperature and reduce the CRI of the emitted white light. In preferred embodiments, color quality management can be handled by separating the conversion dyes, for example, such that the green and red color emitters are placed in a separate layer, or such that green and red color emitters are placed together in a layer separate from a yellow color emitter. In particular, it is preferred that green and red color emitters are placed closer to the viewer (farther from the blue light emitting diode source), with the yellow emitting dye being placed closer to the source. In this way, the distribution of green light into the viewing hemisphere can be maximized.

Accordingly, the spectrum of light emitted from the lighting device can be controlled by separating some or all of the photoluminescent (e.g. phosphorescent or fluorescent) components into separate layers, and/or separating photoluminescent (e.g. phosphorescent or fluorescent) components from other dyes and/or pigments that can absorb light emitted from the light emitting diode or other photoluminescent (e.g. phosphorescent or fluorescent) components within the color conversion sheet into separate layers. In some embodiments lower wavelength spectral components may be optimized by separating the color changing components so that the photoluminescent (e.g. phosphorescent or fluorescent) components (and other dyes and/or pigments) that absorb such lower wavelength spectral components are positioned behind (e.g. closer to the light guide panel 112) another layer of the color conversion sheet 122 that contains photoluminescent (e.g. phosphorescent or fluorescent) components that absorb high wavelength spectral components.

In some embodiments a first layer may comprise a first photoluminescent material and a second layer may comprise a second photoluminescent material, the first photoluminescent material having a first absorption spectrum and a first radiation spectrum, and the second photoluminescent material having a second absorption spectrum and a second radiation spectrum. Preferably, at least one of the first and second absorption spectra at least partially overlaps with a primary radiation spectrum of the primary emission source (i.e. the light emitting diode). In some embodiments both of the first and second absorption spectra at least partially overlap with a primary radiation spectrum of the primary emission source (i.e. a light emitting diode). In a specific embodiment, the second photoluminescent material has an absorption spectrum that at least partially overlaps with the radiation spectrum of the first radiation spectrum.

In some embodiments a first layer may comprise a first photoluminescent material and a second layer may comprise a second photoluminsecent material, the first photoluminscent material having a first absorption spectrum and emitting light having a first average wavelength, and the second photoluminescent material having a second absorption spectrum and emitting light having a second average wavelength. Preferably, at least one of the first and second absorption spectra at least partially overlaps with a primary radiation spectrum of the primary emission source (i.e. the light emitting diode). In some embodiments both of the first and second absorption spectra at least partially overlap with a primary radiation spectrum of the primary emission source (i.e. a light emitting diode). In some embodiments the first, second and third photoluminescent materials serve to shift the primary emission from the primary light source (i.e. the light emitting diode) to an emitted light from the lighting device, wherein the emitted light has a longer wavelength than the primary emission. In some embodiments the first average wavelength corresponds to a green color and the second average wavelength corresponds to a yellow, orange, or red color. In some embodiments the first average wavelength corresponds to a yellow color and the second average wavelength corresponds to an orange or red color. In some embodiments a first average wavelength corresponds to an orange color and the second average wavelength corresponds to a red color.

In some embodiments a first layer may comprise a first photoluminescent material and a second photoluminescent material, and a second layer may comprise a third photoluminsecent material, the first photoluminscent material having a first absorption spectrum and a first radiation spectrum, the second photoluminescent material having a second absorption spectrum and a second radiation spectrum, and the third photoluminescent material having third absorption spectrum and a third radiation spectrum. Preferably, at least one of the first, second, and third absorption spectra at least partially overlaps with a primary radiation spectrum of the primary emission source (i.e. the light emitting diode). In some embodiments two, or all of the first, second, and third absorption spectra at least partially overlaps with a primary radiation spectrum of the primary emission source (i.e. a light emitting diode). In a specific embodiment, the third photoluminescent material has an absorption spectrum that at least partially overlaps with the radiation spectrum of at least one of or both the first radiation spectrum and the second radiation spectrum. In some embodiments the second absorption spectrum may at least partially overlap with the first radiation spectrum.

In some embodiments a first layer may comprise a first photoluminescent material and a second photoluminescent material, and a second layer may comprise a third photoluminsecent material, the first photoluminscent material having a first absorption spectrum and emitting light having a first average wavelength, the second photoluminescent material having a second absorption spectrum and emitting light having a second average wavelength, and the third photoluminescent material having third absorption spectrum emitting light having a third average wavelength. Preferably, at least one of the first, second, and third absorption spectra at least partially overlaps with a primary radiation spectrum of the primary emission source (i.e. the light emitting diode). In some embodiments two, or all of the first, second, and third absorption spectra at least partially overlaps with a primary radiation spectrum of the primary emission source (i.e. a light emitting diode). In a specific embodiment, the third photoluminescent material has an absorption spectrum that at least partially overlaps with one or both of the first and second average wavelength. In some embodiments the second absorption spectrum may at least partially overlap with the first average wavelength.

In some embodiments the first, second and third photoluminescent materials serve to shift the primary emission from the primary light source (i.e. the light emitting diode) to an emitted light from the lighting device, wherein the emitted light has a longer wavelength than the primary emission. In some embodiments the first or second average wavelength corresponds to a green color and the third average wavelength corresponds to a yellow, orange, or red color. In some embodiments the first or second average wavelength corresponds to a yellow color and the third average wavelength corresponds to an orange or red color. In some embodiments a first or second average wavelength corresponds to an orange color and the third average wavelength corresponds to a red color.

In some embodiments where a color conversion sheet 122 comprises more than one layer, one of a first layer 122a and a second layer 122b can include dyes that emit green light, such as diisobutyl 4,10-dicyanoperylene-3,9-dicarboxylate, fluorescein, and Coumarin 6. In some embodiments where a color conversion sheet 122 comprises more than one layer, one of a first layer 122a and a second layer 122b can include dyes that emit red light, such as 1,6,7,12-tetraphenoxy-N, N'-di(2,6-diisopropylphenyl)-3,4:910-perylene-diimide and 5,10,15,20-tetra(9,9-dihexyl-9H-fluoren-2-yl)porphyrin. In some embodiments where a color conversion sheet 122 comprises more than one layer, one of a first layer 122a and a second layer 122b can include one or more dyes that emit green light such as diisobutyl 4,10-dicyanoperylene-3,9-dicarboxylate, fluorescein, and Coumarin 6, and one or more dyes that emit red light, such as 1,6,7,12-tetraphenoxy-N, N'-di(2,6-diisopropylphenyl)-3,4:910-perylene-diimide and 5,10,15,20-tetra(9,9-dihexyl-9H-fluoren-2-yl)porphyrin. In some embodiments where a color conversion sheet 122 comprises more than one layer, one of a first layer 122a and a second layer 122b can include dyes that emit yellow light, such as 3-cyanoperylene-9,10-dicarboxylic acid 2'6'-diisopropylanilide and Eosin Y. In some embodiments where a color conversion sheet 122 comprises more than one layer, one of a first layer 122a and a second layer 122b can include one or more dyes that emit green light, such as diisobutyl 4,10-dicyanoperylene-3,9-dicarboxylate, fluorescein, and Coumarin 6, and one or more dyes that emit red light, such as 1,6,7,12-tetraphenoxy-N,N'-di(2,6-diisopropylphenyl)-3,4:9¹0-perylene-diimide and 5,10,15,20-tetra(9,9-dihexyl-9H-fluoren-2-yl)porphyrin, while the other of a first layer 122a and a second layer 122b can include one or more dyes that emit yellow light, such as 3-cyanoperylene-9,10-dicarboxylic acid 2'6'-diisopropylanilide and Eosin Y. The foregoing embodiments are provided as examples of layering of different types of photoluminescent (e.g. phosphorescent or fluorescent) dyes within color changing sheet 122; other combinations of layers comprising different dyes are within the scope of the invention.

In a specific embodiment, a lighting device comprises a color conversion sheet comprising a first layer 122a comprising diisobutyl 4,10-dicyanoperylene-3,9-dicarboxylate and 1,6,7,12-Tetraphenoxy-N,N'-di(2,6-diisopropylphenyl)-3,4:9¹0-perylene-diimide, and a second layer 122b comprising 3-cyanoperylene-9,10-dicarboxylic acid 2'6'-diisopropylanilide.

In some embodiments, color conversion sheet 122 further includes materials to optically scatter the light emitted into color conversion sheet 122 by light guide panel 112 and/or the converted light that is ultimately emitted from color conversion sheet 122. The scattering of the light can increase the effective optical path length of the color conversion sheet 122 thereby increasing the amount of light that is absorbed and converted to a desired wavelength. For example, the scattering of the emitted light serves to alter the path of emitted light rays that would otherwise be emitted from the edges of the color conversion sheet 122 due to total internal reflection.

Color conversion sheet 122 enables system 100 to provide distinct advantages over existing LED lighting systems. For example, light guide panels used for conventional lighting systems typically include structures such as unevenly-spaced bumps formed within them to uniformly extract light from the front of the light guide panel. Since these scattering structures can be undesirable from an aesthetic standpoint, conventional lighting applications typically include an additional diffuser sheet or component placed in front of the light guide panel to conceal the scattering structures. Color conversion sheet 122 can eliminate the need for such an additional diffuser panel component as the materials used to optically scatter the light in the color conversion sheet sufficiently diffuse the light emitted from system 100 without negatively affecting the aesthetic appeal of system 100.

Further, due to the molecular dissolution of the organic dyes used for color conversion sheet 122, the light converted by color conversion sheet 122 provides a superior color uniformity and conversion efficiency over existing LEDs that use a rare-earth-containing phosphor coating to effect a color conversion. Accordingly, the superior color uniformity provided by color conversion sheet 122 allows LEDs having a wider binning tolerance to be used to achieve a desired color of light. In addition, the increased conversion efficiency allows fewer LEDs to be used for a given lighting application, which results in a component cost savings, as well as a reduction in energy consumption and thermal management challenges for a desired lumen output.

Further advantages are provided by the structure of color conversion sheet 122, which is highly customizable, and can be used to create more vivid and saturated colors to satisfy specific requirements. For example, color conversion sheet 122 can include several different color conversion materials such as phosphorescent or fluorescent (e.g. organic fluorescent) dyes configured to convert the color of the light emitted by LEDs 108 to multiple colors. In some embodiments, color conversion sheet 122 includes color conversion materials that are arranged to reproduce a color image for applications such as billboard advertising. In some embodiments, color conversion materials are applied to color conversion sheet 122 in a printing process.

In some embodiments, system 100 may further comprise a stability enhancement layer 126. Exemplary stability enhancement layers are described in U.S. Pat. No. 8,664,624 to Kingsley, et al., which is incorporated by reference herein. Stability enhancement layer 126 may protect said photoluminescent materials of the color conversion sheet 122 from light-induced (photolytic) degradation and/or thermal degradation, so as to provide sustained emissions. In one aspect of creating device 100 and as shown in FIG. 1, the stability enhancement layer 126 can be rendered as a discrete layer. While this is preferable, it should be recognized that some functionality of the stability enhancement layer 126 can also be achieved within the color conversion sheet 122 itself by suitable selection of the polymer matrix of the color conversion sheet 122. In certain applications it is advantageous to have a stability enhancement layer 126 on both the top and bottom surfaces of the color conversion sheet 122.

In some embodiments a polymer for use in a stability enhancement layer 126 is thermally stable. Generally, it is advantageous to select a polymer which glass transition temperature is higher than the expected operating temperature of the system 100. In some embodiments it would be desirable to select a polymer with a glass transition temperature that is 10° C. to 15° C. higher than the operating temperature of device 100. In many cases, color change upon prolonged periods of exposure to heat may be evidence of thermal degradation.

In some embodiments a polymer for use in a stability enhancement layer 126 is photolytically stable. Specifically, materials that are known to significantly retard the diffusion of oxygen may have a dramatic impact on improving photolytic stability.

Thus, to extend the stability of the photoluminescent materials, in some embodiments stability enhancement layer 126 includes, for example, a number of materials commonly used today to inhibit the transmission of air, especially in applications such as food packaging. Such materials include, but are not limited to, polyvinyl alcohol, ethylene vinyl alcohol copolymers, polyvinyl chloride, polyvinylidene chloride copolymers (saran), nylons, acrylonitriles, polyethylene terephthalate polyester, polyethylene naphthalate, polytrimethyl terephthalate, liquid crystal polymers, transparent inorganic oxide coatings, nanocomposites, oxygen scavengers, aromatic polyketones and any combinations or blends thereof. Such materials may be used in a discrete stability enhancement layer 126 and/or incorporated into color conversion sheet 122.

In certain situations it is advantageous to have the stability enhancement layer 126 on both the front and bottom surfaces of the color conversion sheet 122. One of the preferred ways of achieving that is to create a stability enhancement layer 126 that inhibits the transmission of oxygen on one side of the color conversion sheet 122, for example on the side of the converted emission emitting surface, and for the other side the reflection layer. The low diffusion of oxygen through the reflective sheet 120 (e.g. metal oxide layers) may serve as an effective second stability enhancement layer in this case. It should also be noted that for certain applications, a suitably thick polyester substrate onto which are rendered the energy conversion layer and the stability enhancement layer can also provide some functionality in retarding the diffusion of oxygen on from the opposite side.

Singlet molecular oxygen is presumed to be an important reactive species in the photolytic degradation of dyes. While reducing the concentration of oxygen is an effective deterrent to the creation of singlet oxygen, this species can also be quenched by a number of additives, thereby preventing it from reacting with the photoluminescent dye. In some embodiments such quenchers may be placed in the layer in which the singlet oxygen is most readily formed, that is in the color conversion sheet 122. Examples of singlet oxygen quenchers that may be included in color conversion sheet 122 and/or stability enhancement layer 126 include, but are not limited to, 2,2,6,6-tetramethyl-4-piperidone, 1,4-diazabicyclo[2.2.2]octane, and diphenylsulfide.

Conversion sheet 122 can have a substantially different color when light from a light source is being applied to it by LEDs 108 as opposed to when light is no longer being applied. For example, the color conversion sheet 122 used to convert light having a substantially blue color to light having a substantially white color can have a substantially yellow color when the light source (e.g., LEDs 108) is off (e.g. the "off-state"). In the "off state," the blue component of ambient (white) light hitting the color conversion sheet 122 will be converted to yellow light, providing the color conversion sheet 122 with a yellow appearance. Under such circumstances there is no longer enough blue light being applied to color conversion sheet 122 to change the viewer's perception that the light being emitted is white. Without the blue light being applied from LEDs 108, color conversion sheet 122 absorbs a substantial amount of blue light from the ambient light entering system 100 making color conversion sheet 122 appear yellow in color. Accordingly, it can be desirable from an aesthetic standpoint to neutralize the "off-state" color (e.g., yellow color) of color conversion sheet 122 such that system 100 has a substantially white color even when turned off.

Off-state color neutralization can be achieved in several ways. In some embodiments off-state color is neutralized by blocking or reducing the amount of ambient light hitting the color conversion sheet surfaces to avoid or reduce down-conversion of ambient light, In some embodiments off-state color is neutralized by reducing or minimizing the amount of converted yellow light that emits from the luminaire front surface. In still other embodiments, off-state color is neutralized by redirecting the converted ambient light away from the viewer. In other embodiments, off-state color is neutralized by providing additional blue light to neutralize the yellow "off-state" color.

In some embodiments, system 100 includes a power limiting circuit or limited power source that is enabled when the main power to system 100 is turned off. The power limiting circuit or limited power source can be configured to provide a small amount of power to LEDs 108 such that LEDs 108 generate just enough light to be absorbed by color conversion sheet 122 and change its off-state color to a more aesthetically-pleasing color, for example from a yellow off-state color to white. In some embodiments, the power provided to LEDs 108 by the power limiting circuit or limited power source is less than 1% of the nominal operating power of system 100. In other embodiments it is far less than 1%, such as less than 0.5%, less than 0.25%, less than 0.1%, less than 0.05%, less than 0.01%, less than 0.005%, less than 0.001%, less than 0.0005% or less than 0.0001%. The power limiting circuit or limited power source can provide power to LEDs 108 from a battery, e.g., mounted to fixture frame 102, and the power limiting circuit or limited power source can include a circuit for charging the battery when main power is applied to system 100. In some embodiments, the power limiting circuit or limited power source is configured to provide power from a second power supply having a lower power output rating than power supply 128. In some embodiments, the power limiting circuit or limited power source is configured to reduce the power provided to LEDs 108 when the main power to system 100 is turned on.

System 100 can further include proximity sensor 132a mounted to fixture frame 102 for detecting the movement of a person in proximity to system 100. In some embodiments, proximity sensor 132a is mounted to a front surface of fixture frame 102. In some embodiments, proximity sensor 132a is mounted to fixture frame 102 in an orientation according to where movement will being sensed. Proximity sensor 132a can be used in conjunction with the power limiting circuit to conserve power when the power limiting circuit or limited power source is sourcing its power from a battery. For example, the power limiting circuit or limited power source can be configured to only provide power to change the off-state color of color conversion sheet 122 when proximity sensor 132a senses that a person is nearby. In some embodiments, proximity sensor 132a is used in conjunction with the main power circuit to conserve power in substantially the same manner when main power is on, i.e., main power is only applied to system 100 when proximity sensor 132a senses that a person is nearby. In some embodiments, system 100 includes a power source other than main power or battery power for supplying power to proximity sensor 132a and/or the power limiting circuit or limited power source.

In some embodiments, system 100 includes a mechanically-actuated louver or shutter that can be closed to conceal color conversion sheet 122 when main power to system 100 is turned off. In some embodiments, a two-way mechanical switch coupled to the main power of system 100 is actuated to open and close the louver or shutter when the main power is turned on and off respectively.

In some embodiments, an air gap between the components of system 100 can be used to neutralize the off-state color of color conversion sheet 122. For example, color conversion sheet 122 and light guide 112 can be mounted in fixture frame 102 such that there is an air gap between adjacent surfaces of the two components. The width of the air gap can be chosen such that the amount of ambient light that is reflected back out of system 100 is minimized to reduce or prevent illumination of color conversion sheet 122 and to reduce or prevent light emission from the color conversion sheet 122 in the off-state. In some embodiments, an air gap is used between light guide 112 and reflective sheet 120 to limit the amount of ambient light that is reflected back out of system 100 to reduce or prevent the illumination of color conversion sheet 122 and to reduce or prevent light emission from the color conversion sheet 122 in the off-state. In some embodiments, system 100 includes a diffuser sheet 123 positioned in front of color conversion sheet 122 and an air gap is similarly used to limit the amount of ambient light that is reflected back out of system 100 to reduce or prevent the illumination of color conversion sheet 122. In some embodiments, a gasket is installed between color conversion sheet 122 and light guide 122, light guide 122 and reflective sheet 120 and/or between a diffuser sheet 123 and color conversion sheet 122 to set the width of the air gap. In some embodiments the ratio of the thickness of the air gap to the thickness of the color conversion sheet 122 is about 10:1, about 15:1, about 20:1, about 25:1, about 30:1, about 35:1, about 40:1, about 45:1, or about 50:1. In some embodiments the ratio of the thickness of the air gap to the thickness of the color conversion sheet is in a range of about 10:1 to about 50:1, about 10:1 to about 25:1, or about 25:1 to about 50:1.

In some embodiments, system 100 includes light direction control optics such as brightness enhancement film (BEF), microlenses, or macrolenses, for directing reflected ambient light to a larger viewing angle (i.e. angle of dispersion), where the viewing angle refers to the angle of the cone of emitted (e.g. reflected ambient) light. For example, a larger viewing angle may direct reflected ambient light (e.g., toward the ceiling) to reduce the reflected ambient light from color conversion sheet 122 that can be seen by people occupying a room. In some embodiments, system 100 includes light direction control optics such as brightness enhancement film (BEF), microlenses, or macrolenses to limit the irradiance of ambient light upon the energy conversion film by limiting the angle of light reaching the film. In such embodiments, reflection of light from the color conversion sheet 122 is diffuse and the emission is isotropic, most of the light leaving the conversion film will not be at an angle to successfully leave the brightness enhancement optic, limiting the intensity of reflected and emitted (e.g. yellow) light. In some embodiments one or more light direction control optics are positioned in front of the color conversion sheet 122.

In some embodiments, the reflective surface of reflective sheet 120 comprises an electrophoretic film or material that changes from a substantially reflective color (e.g., white) to a substantially non-reflective color (e.g., black) when the main power is turned off to minimize the amount of ambient light that is reflected back out of system 100 so that color conversion sheet 122 is accordingly only dimly illuminated, or not illuminated. In some embodiments device 100 includes an electro-optic shutter that is transparent or substantially transparent, allowing light from the color conversion sheet 122 to pass through the electro-optic shutter when the main power is turned on, but changes to opaque or substantially opaque when the main power is off, preventing or minimizing light from the color conversion sheet 122 from passing through the electrophoretic shutter.

System 100 can include a dimming control 132*b* coupled to fixture frame 102 for enabling the brightness of the light provided by system 100 to be adjusted. In some embodiments, dimming control 132*b* adjusts the brightness of the light provided by system 100 by adjusting the power provided by power supply 128 to LEDs 108. Dimming control 132*b* can be any analog or digital dimming circuit known in the art. For example, dimming control 132*b* can be a potentiometer, variable resistor, or similar device that is coupled in series with power supply 128 to adjust the power that power supply 128 provides to LEDs 108. In some embodiments, dimming control 132*b* includes a control circuit to adjust the voltage that power supply 128 provides to LEDs 108. In some embodiments, dimming control 132*b* adjusts the power provided by power supply 128 to LEDs 108 by varying the pulse width of a pulse wave modulated (PWM) power signal.

In some embodiments, device 100 can be coupled with a driver to modulate the intensity of light emitted from device 100. Device 100 when coupled with an intensity modulating driver can be used to perform Visible Light Communication (VLC)/LiFi (Light Fidelity), providing primary connectivity of digital devices (computers, laptops, tablet, and smart phones) to each other and to the broader internet. Connectivity may be provided through an array of access points, as described in the IEEE 802.11 standard, which is incorporated herein by reference, and its variants. To produce a useful data signal, the intensity of the light emitted from device 100 is rapidly modulated by the driver, with the maximum modulation rate limited by the decay profile of the light source (e.g. phosphorescent or fluorescent dye in color conversion sheet 122). In some embodiments a driver modulates light from device 100 at electronic communication speeds, typically measured in MHz, in order to transmit information to receivers embedded in electronic devices. In some embodiments, a driver is configured to modulate the intensity of light emitted from lighting device 100 at a rate of about 10-100 MHz, about 20-70 MHz, or about 20-50 MHz. For the blue LED 108, this can be extremely fast, (e.g. picosecond timescale). However, the rate at which light intensity can be modulated of typical phosphor-converted white light emitting device is limited by the emission lifetime (1/e value) of the conversion phosphor, which for the YAG phosphors typical of white LED sources is usually around 70 nanoseconds, limiting the raw data rate to approximately 10 Mbits/second. In embodiments of the invention, the one or more photoluminescent (e.g. photoluminescent (e.g. phosphorescent or fluorescent) dyes of color conversion sheet 122 take the place of the YAG phosphor. The emission lifetimes of such fluorescent dyes are around 5-8 nanoseconds, in some embodiments, about an order of magnitude smaller than that of the phosphor, so that the data rate can be increased to around 100 Mbits/second by using a lighting device according to an embodiment of the invention. In some embodiments a lighting device includes a color conversion panel comprising a fluorescent dye with an emission lifetime of about 1-30 ns, about 1-20 ns, about 1-10 ns, about 5-15 ns, about 5-10 ns, about 1 ns, about 2 ns, about 3 ns, about 4 ns, about 5 ns, about 6 ns, about 7 ns, about 8 ns, about 9 ns, or about 10 ns. Accordingly, in some embodiments a lighting device can emit light capable of transferring data at a rate of about 50 Mbits/second to about 150 Mbits/second, about 75 Mbits/second to about 125 Mbits/second, about 70 Mbits/second, about 80 Mbits/second, about 90 Mbits/second, about 100 Mbits/second, about 110 Mbits/second, or about 120 Mbits/second.

In some embodiments, device 100 can be coupled with a central management system and driven by Power over Ethernet ("PoE"). In such embodiments, a central management system comprises an ethernet cable through which electrical power and data can be transmitted. The central management system may comprise a server that manages the distribution of power to one or more lighting devices and/or other devices. In some embodiments the central management system may further comprise a patch panel, a switch, and/or a power supply.

In some embodiments, system 100 can include a Wi-Fi communications device 132*c* coupled to fixture frame 102 for enabling system 100 to wirelessly communicate with a remotely-operated computing device such as a smartphone or laptop computer. In some embodiments, Wi-Fi communications device 132*c* is coupled to dimming control 132*b*, and can provide instructions for dimming control 132*b* to adjust the brightness of the light provided by system 100 in response to commands received from a remotely-operated computing device.

In some embodiments, a Wi-Fi communications device 132*c* from a first system 100 can communicate with Wi-Fi communications devices 132*c* from one or more other systems 100 to coordinate operation of multiple systems 100. In some embodiments, a Wi-Fi communications device 132*c* from a first system 100 communicates with Wi-Fi communications devices 132c from one or more other systems 100 in a master-slave arrangement to coordinate the execution of commands received from a remotely-operated computing device. For example, in response to receiving commands to dim the lighting in a particular room or area of a room, a first system 100 can act as a master and provide appropriate commands to one or more other slave systems 100 in proximity to the first system 100 to coordinate dimming of the lighting provided by all systems 100 in a particular room or area. In some embodiments, systems 100 coordinate the execution of commands to create a desired brightness gradient within a room or an area of a room according to the location of each system 100. For example, systems 100 located within a conference room in which a projector is being operated can coordinate using Wi-Fi communications devices 132c to provide lighting such that a first group of systems 100 located a first distance from the projector dim their lighting by a first amount (e.g., reduce brightness by 80% of full brightness), a second group of systems 100 located a second distance from the projector greater than the first distance dim their lighting by a second amount (e.g., reduce brightness by 50% of full brightness), and a third group of systems 100 located a third distance from the projector greater than the second distance maintain their existing brightness level (e.g., reduce brightness by 0% of full brightness).

In some embodiments, Wi-Fi communications device 132c is further coupled to proximity sensor 132a and is configured to broadcast a command to one or more systems 100 in response to the detection of movement by proximity sensor 132a. For example, a room or area can include several systems 100 that have entered a dimmed or off state as a result of not having detected movement for a period of time (e.g., a timeout). Upon detection of movement by the proximity sensor 132a of a first system 100, Wi-Fi communications device 132c can wirelessly broadcast a command to one or more systems 100 in the area to indicate that all systems 100 should begin or resume illumination of the room or area.

Figure 2A:
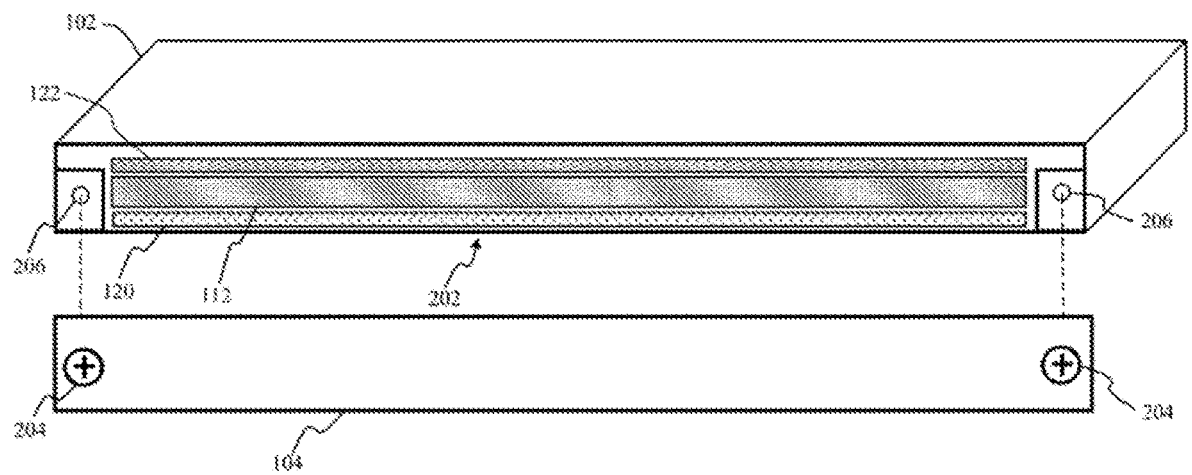
FIG. 2A is an exploded side perspective view of an LED panel lighting system showing a closeable access panel feature according to embodiments of the technology described herein.
Figure 2B:
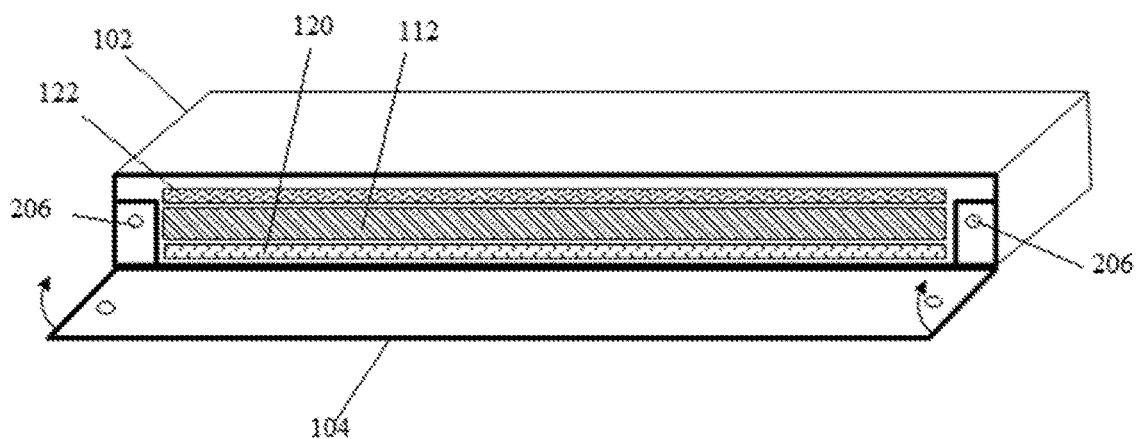
FIG. 2B is an exploded side perspective view of an LED panel lighting system showing a closeable access panel feature according to embodiments of the technology described herein.
Figure 2C:
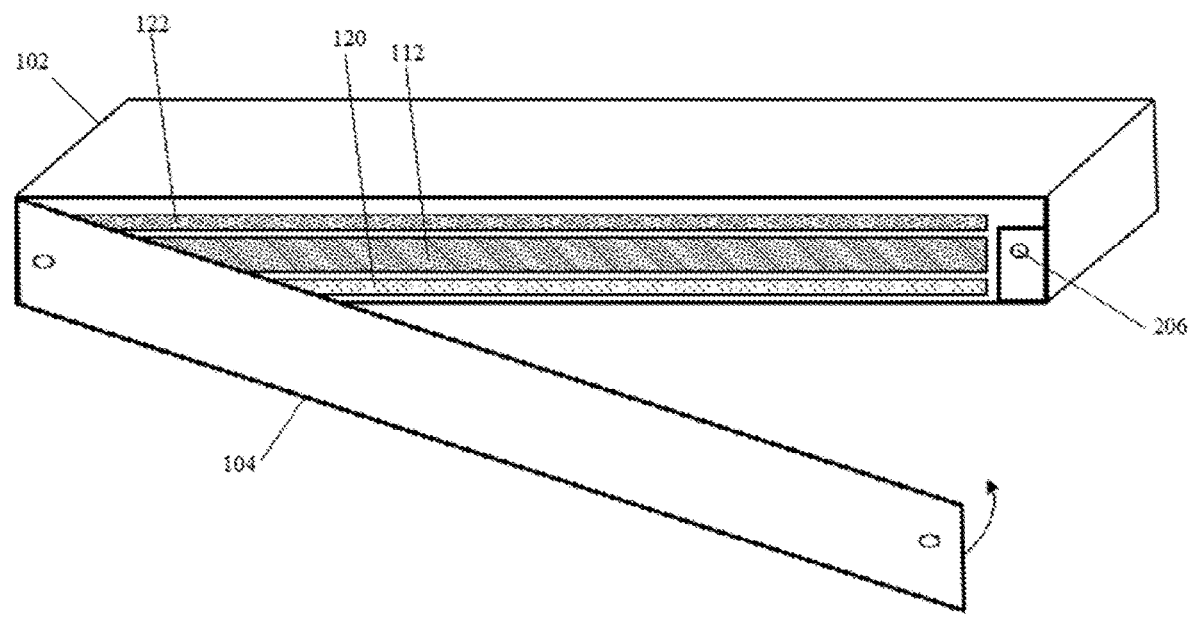
FIG. 2C is an exploded side perspective view of an LED panel lighting system showing a closeable access panel feature according to embodiments of the technology described herein.
Figure 2D:
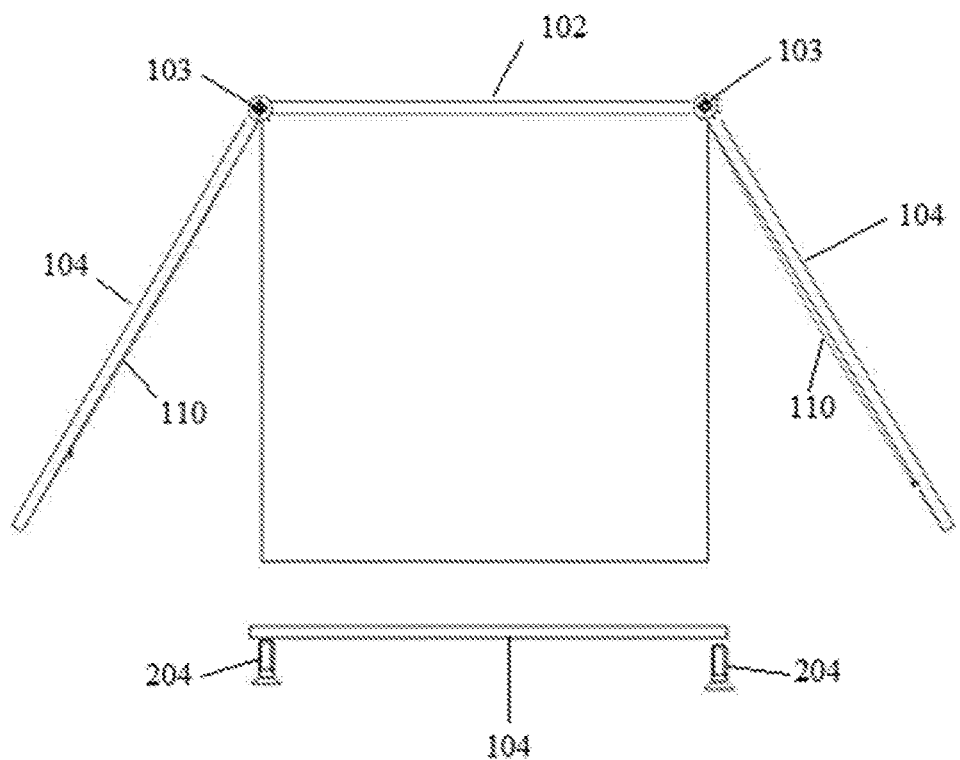
FIG. 2D is an exploded side perspective view of an LED panel lighting system showing a closeable access panel feature according to embodiments of the technology described herein.

FIG. 2A is an exploded side perspective view of system 100 showing access panel 104 according to embodiments of the technology described herein. Access panel 104 can be a planar structure or panel constructed of substantially similar materials as fixture frame 102. In some embodiments access panel 104 may be fully removeable from fixture frame 102, while in other embodiments access panel 104 may remain partially attached to fixture frame 102 when in an open position. As shown in FIG. 2A, access panel 104 includes fasteners 204 for coupling access panel 104 to fixture frame 102 via threaded inserts 206. Fasteners 204 can be screws, bolts, thumbscrews, or any fastening device known in the art. In some embodiments, access panel 104 includes "quick release" fittings that require no more than about ½ turn to decouple access panel 104 from fixture frame 102. In some embodiments, access panel 104 is coupled to fixture frame 102 by a hinge that can be further fitted with a spring to force access panel 104 closed when access to opening 202 is not needed. As shown in FIG. 2B, in some embodiments a hinge 103 may be coupled to a long edge of access panel 104, or as shown in FIG. 2C, in other embodiments a hinge 103 may be coupled to a short edge of access panel 104. In some embodiments, system 100 includes a second access panel at an edge of fixture frame 102 opposite access panel 104, i.e., an edge that does not have an LED strip 110 mounted to it. As shown in FIG. 2D, some embodiments include a second access panel 104, for example in which LED strip 110 may be coupled to fixture frame 102 by a hinge 103. In this way components mounted within fixture frame 102 may be accessed through multiple openings 202; e.g. one, two, or three edges of fixture frame 102 may comprise an access panel.

Access panel 104 can be removed from fixture frame 102 to reveal opening 202, which allows access to components mounted within fixture frame 102. This provides advantages over conventional LED panel lighting systems which are typically sealed upon assembly and not reopened, or require substantial disassembly to service or replace components. For example, access panel 104 can easily be removed to service or replace components such as light guide panel 112, color conversion sheet 122, or reflective sheet 120 while system 100 remains mounted to a ceiling or wall. Although not shown in FIGS. 2A-2D, it should be appreciated that opening 202 can be configured to provide access to other components of system 100 mounted in fixture 102 without departing from the scope of the technology described herein. Further, to meet the different color temperature and color rendition requirements of many commercial lighting applications, conventional LED panel lighting systems typically must replace their LED light sources which can require substantial disassembly or even replacement of the entire lighting system. Conversely, the present technology can easily accommodate any changes in desired color temperature and color rendering index simply by replacing the existing color conversion sheet 122 with a color conversion sheet that converts the light emitted from LEDs 108 according to the new lighting requirements.

A further advantage provided by the technology described herein is its scalability, i.e., its ability to accommodate both large and small form factor lighting system applications. For example, system 100 can be assembled using components configured for use in large form factor lighting systems (e.g., lighted billboards, commercial lighting) that employ hundreds or thousands of LEDs 108, as well as small form factor lighting systems (e.g., retrofit lamps, automotive interior lighting) that employ tens of LEDs 108 to as few as one LED 108.

Embodiments of the technology for small form factor lighting systems include automotive interior lighting applications. For example, system 100 can be configured as a flat panel lighting system for use as an overhead dome or map light for the interior of an automobile. In this configuration, system 100 can be mounted underneath a sun roof or directly mounted to the ceiling of an automobile. A small form factor system 100 can also be integrated into a ceiling-mounted overhead console having a hinged door that can be opened and closed to respectively expose and hide system 100. In some embodiments, system 100 is integrated into a vanity mirror assembly mounted to the driver's side or passenger's side sun visor. System 100 can be further configured as a dashboard light, reading light, gas/brake pedal light, door/step light, trunk light, and cargo area light.

As described above, system 100 can be configured to reproduce a color image. For example, color conversion sheet 122 can be formed using a screen printing process to deposit one or more color conversion materials (e.g., inks made with organic fluorescent dyes) on a film or sheet of transparent or translucent material (e.g., acrylic, polycarbonate) to reproduce text and/or an image. Imagewise printing of color conversion materials may be accomplished using screen printing, inkjet printing, gravure printing, or other printing methods, and can be used for any form factor, including illuminated billboards and small area graphics such as illuminated emblems or logos. An embodiment of system 100 for an automotive lighting application can include a color conversion sheet 122 printed with a logo or design associated with an automobile manufacturer.

The automotive lighting applications of system 100 described above are meant to be exemplary, not exhaustive. It should be appreciated that system 100 can be configured in a variety of form factors using any number of color schemes to provide lighting to any interior surface of an automobile without departing from the scope of the technology described herein.

Figure 5:
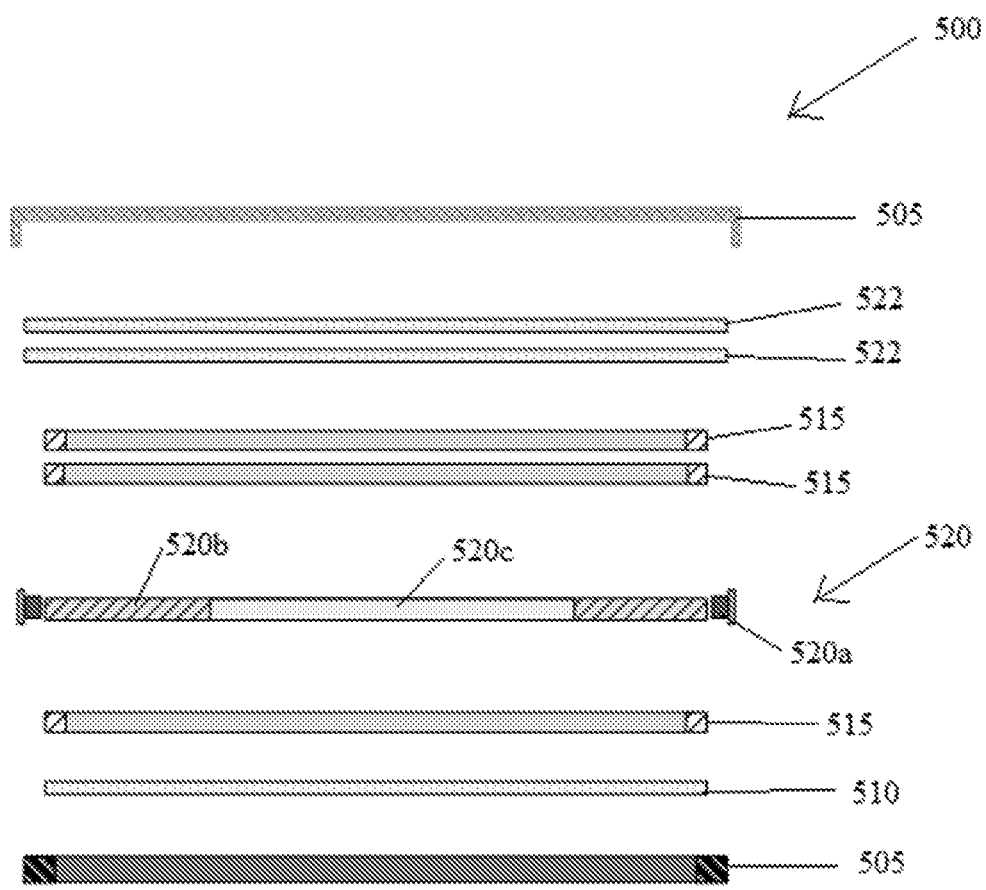
FIG. 5 is an exploded side cut-away view of a speaker including a lighting panel system in accordance with an embodiment of the invention.

Embodiments of the technology for small form factor lighting systems include speaker applications. As described above, system 100 can be configured to reproduce a color image or text. Such system can be incorporated into a speaker structure in order to display a logo or other image. FIG. 5 illustrates a side view of a cross-section of a speaker 500 in accordance with an embodiment of the invention. Such a speaker may include a speaker grill 505, an acoustical scrim 510, one or more spacers 515, and a lighting device 520. The lighting device 520 may comprise at least one LED 520a, or a plurality of LEDs in a LED strip. The lighting device 520 may further comprise a light guide panel 520b with one or more holes 520c, which can be positioned in front of one or more speakers to allow sound to pass undistorted. Light guide panel 520b may include a patterning as described herein with respect to light guide panel 112. Placement of LEDs 108 patterning of light guide panel 520b preferably account for holes 520c to achieve uniform light distribution over the full area, including the acoustically transparent holes. A color conversion panel 522 may comprise a matrix and one or more photoluminescent (e.g. phosphorescent or fluorescent) dyes, as described above, and be positioned adjacent to the light guide, or preferably, a color conversion panel 522 for use in a speaker may comprise an acoustic scrim and one or more photoluminescent (e.g. phosphorescent or fluorescent) dyes. A color conversion panel 522 for use in a speaker can be formed using a screen printing process to deposit one or more color conversion materials (e.g., organic fluorescent dyes) on an acoustic scrim (e.g., polyester, polypropylene) to reproduce text and/or an image. An embodiment of speaker 500 can include a color conversion sheet 522 printed with a logo or design associated with a speaker manufacturer. A logo, design, word, or other image can be printed on color conversion sheet 522 using any screen printing, spray printing, or other transfer printing technology. Similarly, the acoustic scrim 510 may also be provided or patterned with color conversion materials so as to produce an image instead of or in addition to any image produced on acoustic scrim 522.

EXAMPLES

Certain aspects of the present invention may be better understood as illustrated by the following examples, which are meant by way of illustration and not limitation.

Example 1. Comparison of Efficiency of Flat Lens LED and Dome Lens LED

Figure 6A:
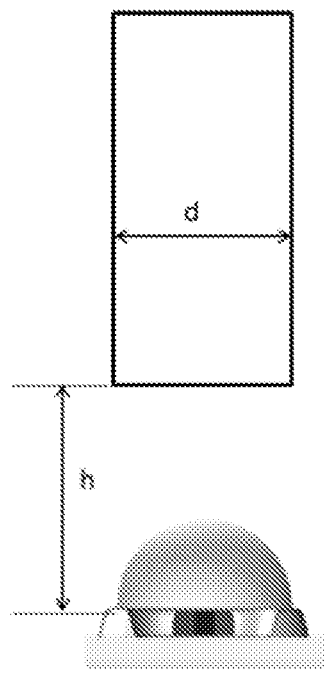
FIG. 6A is a side view of a domed LED in relation with the edge of a light guide panel.
Figure 6B:
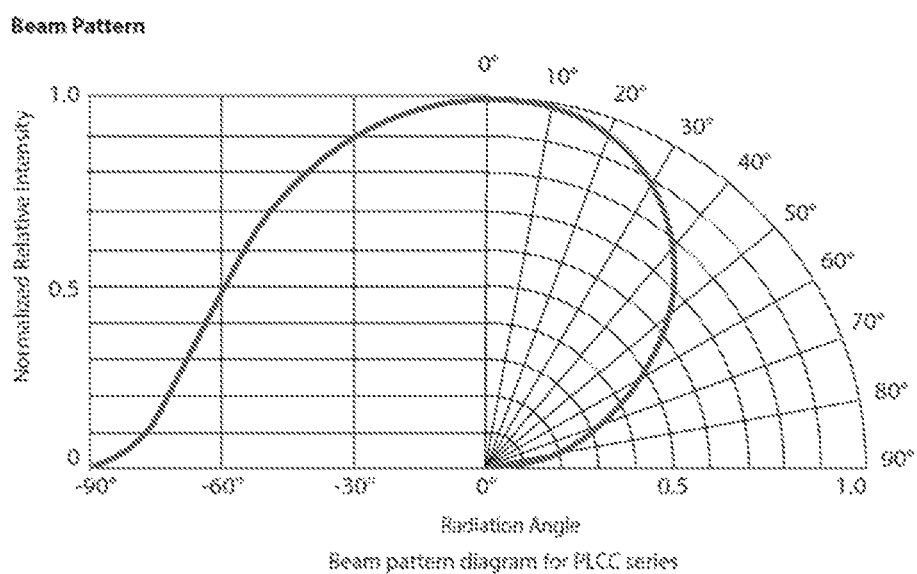
FIG. 6B is a graph illustrating the normalized radiative intensity vs. radiation angle for a flat-lens light emitting diode.

The efficiency of a given light guide panel (LGP) 112 is mainly determined by: (1) Panel thickness (d); (2) Spatial distribution of LED luminous intensity, including viewing angle etc.; and (3) Distance between the LED chip and the injection edge of LGP (h), with these parameters illustrated in FIG. 6a, showing a side view of a LGP and a dome lens LED. The angular displacement of relative luminous intensity of a commercially available blue LED having a dome lens is shown in FIG. 6b. The photon injection efficiency (or light extraction efficiency from the LED source into the light guide panel) can be calculated for light guide panels having different thickness:

| d (mm) | h (mm) | Light extraction efficiency |
|--------|--------|-----------------------------|
| 6 | 5 | 25.6% |
| 6 | 4 | 34.8% |
| 6 | 3 | 49.6% |
| 6 | 2 | 72.3% |
| 6 | 1 | 95.6% |
| 3 | 5 | 8.3% |
| 3 | 4 | 12.5% |
| 3 | 3 | 19.7% |
| 3 | 2 | 34.8% |
| 3 | 1 | 72.3% |

Figure 6C:
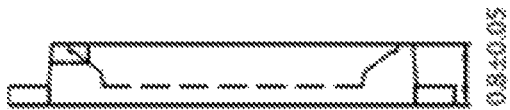
FIG. 6C is a side view of a flat-lens LED.
Figure 6D:
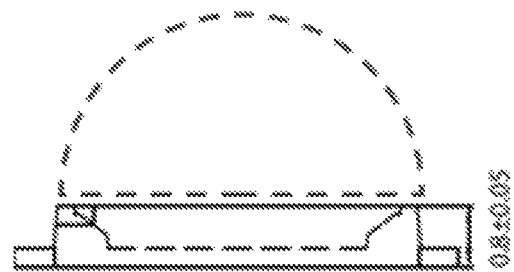
FIG. 6D is a side view of a domed lens LED.

The data in Table 1 shows that thicker LGP generally has higher efficiency. It is also shown that if a LED has a flat-top lens as shown in FIG. 6c, with a package height of about 0.8 mm, the efficiency can get as high as 95.6% for a 6 mm LGP, while if a dome lens is used instead with a package height of about 3 mm, the efficiency drops to less than 50% as illustrated in FIG. 6d.

While the concepts of the present technology have been particularly shown and described above with reference to exemplary embodiments thereof, it will be understood by those of ordinary skill in the art, that various changes in form and detail can be made without departing from the spirit and scope of the concepts described herein. It is to be understood that features from any one embodiment described herein may be combined with features of any other embodiment described herein to form another embodiment of the invention.

What is claimed is:

1. A lighting device comprising:
   a frame having a first edge;
   at least one light emitting diode coupled to an interior of a second edge of the frame;
   a light guide panel positioned in the frame, an edge of the light guide panel in communication with the at least one light emitting diode;
   at least one reflective sheet coupled to a rear surface of the light guide panel; and
   at least one color conversion sheet coupled to a front surface of the light guide panel,
   wherein the at least one color conversion sheet is configured to change a spectral composition of light being transmitted through it.

2. The lighting device according to claim 1, wherein the color conversion sheet comprises a first layer and a second layer, wherein the first layer comprises a first dye and the second layer comprises a second dye.

3. The lighting device according to claim 1, further comprising a power supply coupled to the frame, the power supply providing power to the at least one light emitting diode.

4. The lighting device according to claim 3, further comprising a dimming control coupled to the at least one light emitting diode.

5. The lighting device according to claim 4, further comprising a proximity sensor coupled to one or more of the power supply and the dimming control.

6. The lighting device according to claim 1, further comprising at least one light injection optic coupled to the at least one light emitting diode and the edge of the light guide panel, the at least one light injection optic configured to direct a first light emitted from the at least one light emitting diode into the edge of the light guide panel.

7. The lighting device according to claim 1, further comprising a driver configured to modulate intensity of a light emitted from the lighting device at a rate of about 20 MHz to about 70 MHz.

8. The lighting device according to claim 1, further comprising a color neutralization device for neutralizing a color of the at least one color conversion sheet.

9. The lighting device according to claim 1, wherein the first edge of the frame comprises an access panel.

10. The lighting device according to claim 1, further comprising a first layer of a first ink adhered to a front surface of the at least one color conversion sheet.

11. The lighting device according to claim 10, wherein the first ink comprises a first photoluminescent dye.

12. The lighting device according to claim 10, wherein the first layer of the first ink defines an image or pattern.

13. The lighting device according to claim 11, further comprising a second layer of a second ink adhered to the front surface of the at least one color conversion sheet.

14. The lighting device according to claim 13, wherein the second ink comprises a second photoluminescent dye.

15. The lighting device according to claim 1, further comprising a stability enhancement layer.

16. The lighting device according to claim 15, wherein the stability enhancement layer comprises polyvinyl alcohol, ethylene vinyl alcohol copolymers, polyvinyl chloride, polyvinylidene chloride copolymers (saran), nylons, acrylonitriles, polyethylene terephthalate polyester, polyethylene naphthalate, polytrimethyl terephthalate, liquid crystal polymers, transparent inorganic oxide coatings, nanocomposites, oxygen scavengers, aromatic polyketones or any combinations or blends thereof.

17. The lighting device according to claim 1, wherein the at least one light emitting diode comprises a flat-top lens.

18. An interior lighting device for an automobile comprising a lighting device according to claim 1.

19. A lighting device for an audio device, the audio device comprising a speaker, the lighting device comprising a lighting device according to claim 1.

20. A lighting device comprising:
a frame having a first edge;
at least one light emitting diode coupled to an interior of a second edge of the frame;
a light guide panel positioned in the frame, an edge of the light guide panel in communication with the at least one light emitting diode;
at least one reflective sheet coupled to a rear surface of the light guide panel;
at least one color conversion sheet coupled to a front surface of the light guide panel; and
a stability enhancement layer.

* * * * *